United States Patent
Hashimoto et al.

(10) Patent No.: US 9,882,347 B2
(45) Date of Patent: Jan. 30, 2018

(54) QUANTUM CASCADE LASER ARRAY

(71) Applicant: SUMITOMO ELECTRIC INDUSTRIES, LTD., Osaka (JP)

(72) Inventors: Jun-ichi Hashimoto, Chigasaki (JP); Tsukuru Katsuyama, Yokohama (JP); Hiroyuki Yoshinaga, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/222,765

(22) Filed: Jul. 28, 2016

(65) Prior Publication Data

US 2017/0040769 A1 Feb. 9, 2017

(30) Foreign Application Priority Data

Aug. 6, 2015 (JP) ................... 2015-156225

(51) Int. Cl.
*H01S 5/34* (2006.01)
*H01S 5/042* (2006.01)
(Continued)

(52) U.S. Cl.
CPC .......... *H01S 5/0425* (2013.01); *H01S 5/0261* (2013.01); *H01S 5/0287* (2013.01);
(Continued)

(58) Field of Classification Search
CPC .... H01S 5/0425; H01S 5/0287; H01S 5/2272; H01S 5/4087; H01S 5/2205; H01S 5/0261; H01S 5/3401; H01S 5/125; H01S 5/0285

See application file for complete search history.

(56) References Cited

U.S. PATENT DOCUMENTS 5,221,984 A * 6/1993 Furuyama ............... G02B 6/43
  333/28 R
5,294,815 A * 3/1994 Iechi ..................... H01L 27/153
  257/80
(Continued)

FOREIGN PATENT DOCUMENTS

EP          1863140 A1 * 12/2007  ............ B82Y 20/00
JP          2010-514163     4/2010
WO    WO 2014085562 A1 *  6/2014  ........... H01S 5/3402

OTHER PUBLICATIONS

Lee et al., "Broadband Distributed-Feedback Quantum Cascade Laser Array Operating From 8.0 to 9.8 μm", Jul. 2009, IEEE Photonics Technology Letters, vol. 21, No. 13, 914-916.*
(Continued)

*Primary Examiner* — Joshua King
(74) *Attorney, Agent, or Firm* — Smith, Gambrell & Russell, LLP.

(57) ABSTRACT

A quantum cascade laser includes a substrate having first and second substrate regions arranged along a first axis; a laser structure body including a laser body region having laser waveguide structures extending along the first axis, the laser structure body including first and second regions respectively including the first and second substrate regions, the laser body region having an end facet located at a boundary between the first and second regions, the second region including a terrace extending along the first axis from a bottom edge of the end facet; a plurality of first electrodes disposed on the laser waveguide structures; a plurality of pad electrodes disposed on the terrace; and a plurality of wiring metal bodies each of which includes a first portion on the terrace and a second portion on the end facet. The pad electrodes are connected with the first electrodes through the wiring metal bodies, respectively.

5 Claims, 14 Drawing Sheets

(51) Int. Cl.
  *H01S 5/026* (2006.01)
  *H01S 5/028* (2006.01)
  *H01S 5/22* (2006.01)
  *H01S 5/227* (2006.01)
  *H01S 5/40* (2006.01)
  *H01S 5/125* (2006.01)
  *H01S 5/022* (2006.01)
  *H01S 5/12* (2006.01)

(52) U.S. Cl.
  CPC .......... *H01S 5/2205* (2013.01); *H01S 5/2272* (2013.01); *H01S 5/3401* (2013.01); *H01S 5/4031* (2013.01); H01S 5/026 (2013.01); H01S 5/02276 (2013.01); H01S 5/12 (2013.01); H01S 5/125 (2013.01); H01S 5/22 (2013.01); H01S 5/4087 (2013.01); H01S 2301/176 (2013.01)

(56) References Cited

U.S. PATENT DOCUMENTS

| | | | |
|---|---|---|---|
| 5,544,269 A * | 8/1996 | Hattori | G02B 6/4249 385/88 |
| 5,550,391 A * | 8/1996 | Yamaguchi | B41J 2/45 257/102 |
| 5,627,851 A * | 5/1997 | Takahashi | H01S 5/0207 372/108 |
| 6,034,982 A | 3/2000 | Iwase | |
| 6,043,104 A | 3/2000 | Uchida et al. | |
| 6,553,044 B1 * | 4/2003 | Eden | H01S 5/4031 372/34 |
| 9,257,812 B2 * | 2/2016 | Ide | G02B 26/00 |
| 9,350,140 B2 * | 5/2016 | Yoshinaga | H01S 5/3401 |
| 2002/0018501 A1 * | 2/2002 | Hatakoshi | H01S 5/028 372/43.01 |
| 2007/0001578 A1 * | 1/2007 | Iki | H01S 5/028 313/478 |
| 2008/0144677 A1 * | 6/2008 | Belkin | B82Y 20/00 372/20 |
| 2012/0033697 A1 * | 2/2012 | Goyal | B82Y 20/00 372/45.01 |
| 2014/0355637 A1 * | 12/2014 | Hashimoto | H01S 5/3401 372/45.012 |
| 2015/0236472 A1 * | 8/2015 | Ide | H01S 5/0014 362/553 |
| 2015/0318668 A1 * | 11/2015 | Yoshinaga | H01S 5/3401 372/45.012 |
| 2017/0141542 A1 | 5/2017 | Yoshinaga et al. | |

OTHER PUBLICATIONS

Office Action for U.S. Appl. No. 15/352,159 dated Apr. 19, 2017.

* cited by examiner

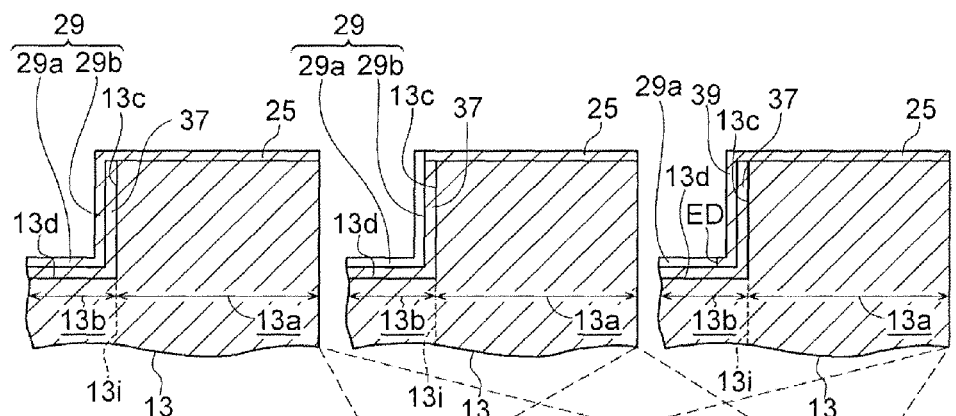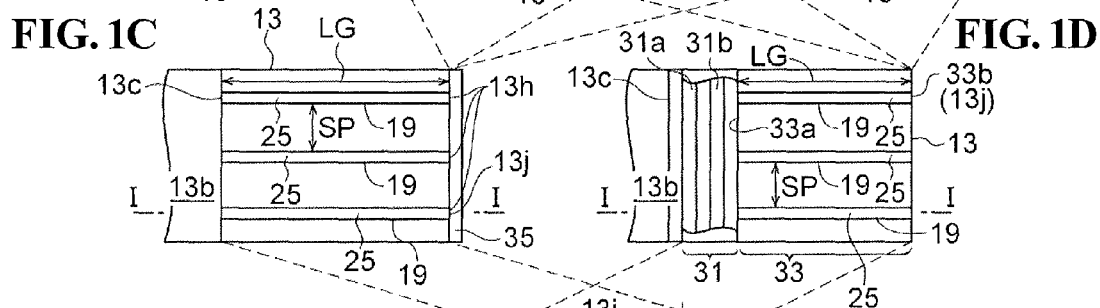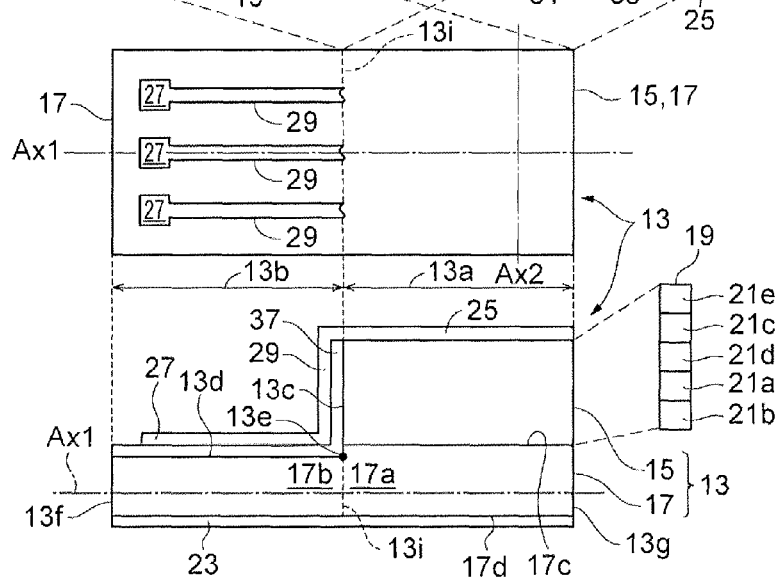

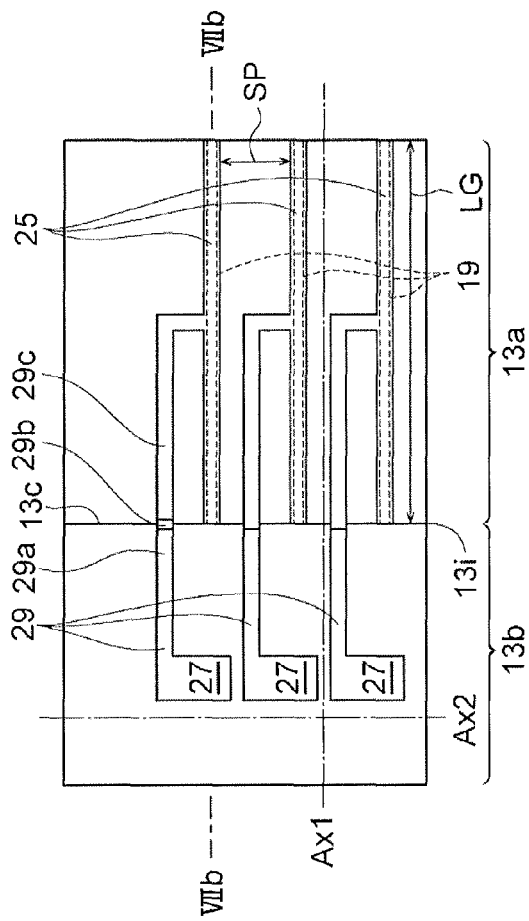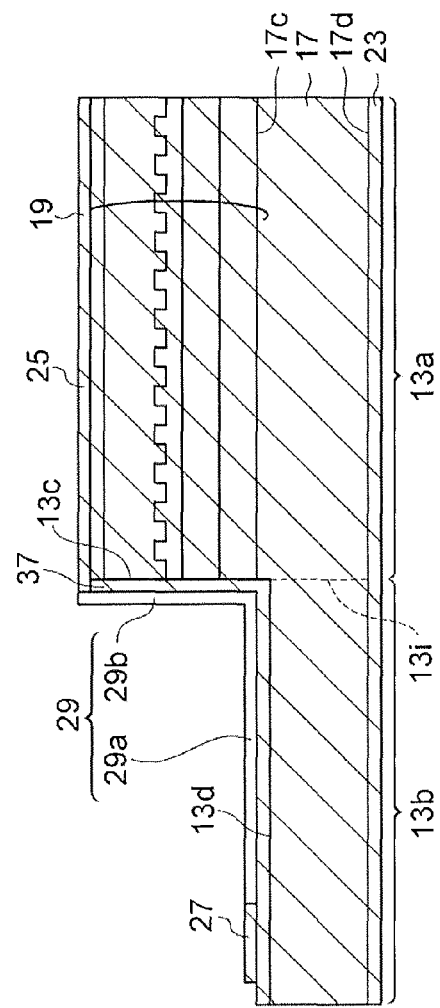
FIG.7A
FIG.7B

QUANTUM CASCADE LASER ARRAY

BACKGROUND OF THE INVENTION

1. Field of the Invention

The present invention relates to a quantum cascade laser.

2. Description of the Related Art

Japanese Unexamined Patent Application Publication (Translation of PCT Application) No. 2010-514163 discloses a quantum cascade laser.

SUMMARY OF THE INVENTION

A quantum cascade laser has a potential as a light source in a mid-infrared wavelength region usable in technical fields, such as environmental gas analysis, medical diagnosis, and industrial machining. Japanese Unexamined Patent Application Publication (Translation of PCT Application) No. 2010-514163 discloses an array of quantum cascade lasers each of which operates in a single mode. This quantum cascade laser array includes a plurality of laser waveguide structures configuring individual quantum cascade lasers, a plurality of electrodes provided on these laser waveguide structures, and a plurality of pad electrodes respectively connected with these electrodes. The distance between the laser waveguide structure and the laser cavity length of the quantum cascade laser correlate with the characteristics and chip size of the quantum cascade laser. Meanwhile, each pad electrode requires a certain size for electrical connection.

In the array structure of quantum cascade lasers, a plurality of unit structures each of which includes a single laser waveguide structure and a pad electrode corresponding to the laser waveguide structure are arrayed. In this array structure, the array structure based on the unit structure affects the arrangement of a plurality of pad electrodes and a plurality of laser waveguide structures. Hence, the arrangement and size of the laser waveguide structures are restricted.

A quantum cascade laser according to an aspect of the present invention includes a substrate having a first substrate region and a second substrate region arranged along a first axis; a laser structure body including a laser body region disposed on the first substrate region, the laser structure body including a first region including the first substrate region and a second region including the second substrate region, the laser body region having a plurality of laser waveguide structures extending along the first axis, the laser body region having an end facet located at a boundary between the first region and the second region, the second region including a terrace extending along the first axis from a bottom edge of the end facet; a plurality of first electrodes each of which is disposed on one of the plurality of laser waveguide structures; a plurality of pad electrodes disposed on the terrace; and a plurality of wiring metal bodies each of which includes a first portion disposed on the terrace, and a second portion disposed on the end facet. Each of the plurality of pad electrodes is connected with one of the plurality of first electrodes through one of the plurality of wiring metal bodies. In addition, the end facet of the laser body region and one of the plurality of laser waveguide structures configure a laser cavity.

The above-described object and other objects, features, and advantageous effects according to the present invention will become apparent from the detailed description on preferable embodiments of the present invention provided below with reference to the accompanying drawings.

BRIEF DESCRIPTION OF THE DRAWINGS

FIGS. 1A to 1G are drawings schematically showing a quantum cascade laser according to an embodiment.

FIGS. 7A and 7B are drawings showing a quantum cascade laser according to Example 2.

DESCRIPTION OF THE PREFERRED EMBODIMENTS

Figure 2A:
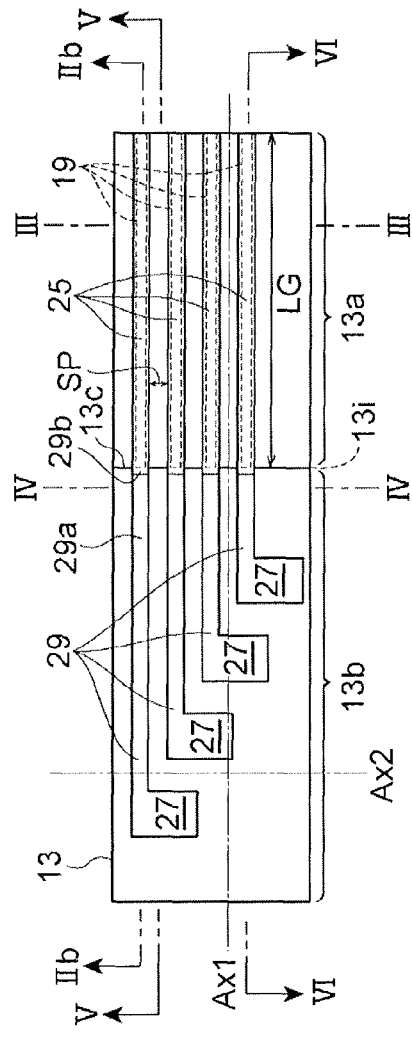
FIGS. 2A and 2B are drawings showing a quantum cascade laser according to Example 1.

Continuing from the above description, some specific examples are described.

A quantum cascade laser according to an embodiment includes (a) a substrate having a first substrate region and a second substrate region arranged along a first axis; (b) a laser structure body including a laser body region disposed on the first substrate region, the laser structure body including a first region including the first substrate region and a second region including the second substrate region, the laser body region having a plurality of laser waveguide structures extending along the first axis, the laser body region having an end facet located at a boundary between the first region and the second region, the second region including a terrace extending along the first axis from a bottom edge of the end facet; (c) a plurality of first electrodes each of which is disposed on one of the plurality of laser waveguide structures; (d) a plurality of pad electrodes disposed on the terrace; and (e) a plurality of wiring metal bodies each of which includes a first portion disposed on the terrace, and a second portion disposed on the end facet. Each of the plurality of pad electrodes is connected with one of the plurality of first electrodes through one of the plurality of wiring metal bodies. In addition, the end facet of the laser body region and one of the plurality of laser waveguide structures configure a laser cavity.

In this quantum cascade laser, the plurality of laser waveguide structures and the plurality of first electrodes are provided in the first region in which the pad electrodes are not formed. As a result, the distance between the individual laser waveguide structures and the laser cavity length may be set without restriction by the arrangement of the plurality of pad electrodes. Also, the plurality of pad electrodes is disposed on the terrace of the second region, and the arrangement of the plurality of pad electrodes is not restricted by the distance between the laser waveguide structures, the cavity length, or the arrangement of the plurality of first electrodes. Since the first region and the second region of the laser structure body extend along the first axis, each of the pad electrodes on the second region is connected with one of the plurality of first electrodes on the laser semiconductor region of the first region through one of the wiring metal bodies crossing the boundary between the first region and the second region.

In the quantum cascade laser according to the embodiment, each of the plurality of wiring metal bodies may further include a third portion disposed on the laser body region.

In this quantum cascade laser, each wiring metal body includes the first portion, the second portion, and the third portion. Each of the plurality of pad electrodes is connected with one of the plurality of first electrodes through the third portion of one of the plurality of wiring metal bodies.

In the quantum cascade laser according to the embodiment, preferably, each of the plurality of laser waveguide structures includes a core layer having a core end facet. The end facet includes the core end facet of the core layer. The second portion of the wiring metal body is separated from the core end facet of the core layer.

In this quantum cascade laser, the wiring metal body is separated from the core end facet of the core layer that is exposed at the end facet of the laser body region. Hence, the wiring metal body does not disturb emission of light from the core end facet of the core layer. Accordingly, emission light from the core end facet of the core layer of each waveguide structure may be used as monitor light for monitoring the oscillation state of the quantum cascade laser in each waveguide structure.

In the quantum cascade laser according to the embodiment, preferably, each of the plurality of laser waveguide structures includes a core layer having a core end facet. The end facet includes the core end facet of the core layer. The second portion of the wiring metal body has a portion disposed on the core end facet of the core layer.

In this quantum cascade laser, the wiring metal body includes the portion disposed on the core end facet of the core layer. As a result, the reflectivity of the core end facet serving as an end-facet mirror of a laser cavity may be increased.

The quantum cascade laser according to the embodiment may further include a metal layer. Each of the plurality of laser waveguide structures may include a core layer having a core end facet. The end facet may include the core end facet of the core layer. The metal layer may be disposed on the core end facet of the core layer of at least one of the plurality of laser waveguide structures. In addition, the metal layer may be isolated from the second portion of the wiring metal body on the end facet.

In this quantum cascade laser, on the end facet, the metal layer is isolated from the second portion of the wiring metal body and is disposed on the core end facet of the core layer. As a result, this structure may prevent the second portion of the wiring metal body from disturbing the reflection from the core end facet of the core layer in the laser waveguide structure. Further, since the metal layer is disposed on the core end facet of the core layer, the reflectivity of the core end facet serving as an end-facet mirror of a laser cavity may be increased.

In the quantum cascade laser according to the embodiment, preferably, the laser body region includes a distributed Bragg reflector region and a laser semiconductor region arranged along the first axis. The laser semiconductor region has a semiconductor end facet extending in a direction intersecting with the first axis. The distributed Bragg reflector region includes a single or a plurality of high refractive index portions extending in a direction of the normal to a principal surface of the substrate. The high refractive index portions are isolated from the semiconductor end facet of the laser semiconductor region. The distributed Bragg reflector region includes the end facet. In addition, the distributed Bragg reflector region is disposed between the second region and the laser semiconductor region.

In this quantum cascade laser, the distributed Bragg reflector region functions as a reflection mirror of the laser cavity.

In the quantum cascade laser according to the embodiment, the plurality of laser waveguide structures may reach the end facet.

In this quantum cascade laser, the end facet functions as a reflection mirror of the laser cavity.

The findings of the present invention can be easily understood by regarding the following detailed description with reference to the accompanying drawings shown as examples. Continuing from the above description, an embodiment relating to a quantum cascade laser (QCL) is described with reference to the accompanying drawings. The same reference sign is applied to the same part if possible.

FIGS. 1A to 1G are drawings schematically showing a quantum cascade laser having a diffraction grating, according to this embodiment. FIG. 1A is a plan view showing the quantum cascade laser. FIG. 1B is a longitudinal cross section schematically showing a laser waveguide structure. FIGS. 1C and 1D are plan views showing arrangement forms of the laser waveguide structure and a semiconductor structure. A quantum cascade laser 11 includes a semiconductor laser array having a plurality of quantum cascade lasers. Specifically, the quantum cascade laser 11 includes a laser structure body 13, and the laser structure body 13 includes a laser body region 15 and a substrate 17. The laser body region 15 includes a plurality of laser waveguide structures 19 each of which constitutes a laser cavity of the quantum cascade laser. Each of the laser waveguide structures 19 extends in a direction along a first axis Ax1. In this embodiment, the laser body region 15 includes, for example, three laser waveguide structures 19. The laser structure body 13 includes a first region 13a and a second region 13b. The first region 13a and the second region 13b are arranged in the direction along the first axis Ax1. The first region 13a and the second region 13b respectively include a first substrate region 17a and a second substrate region 17b of the substrate 17. The laser body region 15 is provided on the first substrate region 17a. The first region 13a of the laser structure body 13 includes a plurality of laser cavities formed of the laser waveguide structures 19.

The quantum cascade laser 11 includes a plurality of first electrodes 25, a plurality of pad electrodes 27, and a plurality of wiring metal bodies 29 respectively corresponding to the plurality of laser waveguide structures 19. The first electrodes 25, the pad electrodes 27, and the wiring metal bodies 29 are provided on the laser structure body 13. Each of the pad electrodes 27 is connected with one of the plurality of first electrodes 25 through one of the plurality of wiring metal bodies 29. Each of the first electrodes 25 has a portion provided on the laser waveguide structure 19. Each of the laser waveguide structures 19 includes a core layer 21a. The core layer 21a is provided between a lower cladding layer 21b and an upper cladding layer 21c. In this embodiment, each laser waveguide structure 19 includes a diffraction grating layer 21d and a contact layer 21e. In addition, in the diffraction grating layer 21d, a diffraction grating with a predetermined period is formed. A lasing wavelength may be determined by the period of the diffraction grating. The first electrode 25 contacts an upper surface of the laser waveguide structure 19 (for example, the contact layer 21e). The quantum cascade laser 11 has an array structure including a plurality of quantum cascade lasers each including the core layer 21a and the diffraction grating. The core layer 21a generates light with a wavelength in a mid-infrared wavelength region, for example, in a range from about 3 to about 20 μm. In a preferable embodiment, the quantum cascade lasers configuring the array structure in the quantum cascade laser 11 each have diffraction gratings with different periods, and generate light with different wavelengths determined by the periods of the diffraction gratings included in the diffraction grating layers 21d.

The laser structure body 13 includes a first end 13f and a second end 13g. The first end 13f and the second end 13g extend in a direction along a second axis Ax2 intersecting with the first axis Ax1. The second region 13b includes a terrace 13d. The terrace 13d extends from a bottom edge 13e of a first end facet 13c in the direction along the first axis Ax1. In the embodiment, the first end facet 13c serves as an end facet. Furthermore, the terrace 13d reaches the first end 13f of the laser structure body 13 in the embodiment. The plurality of pad electrodes 27 are provided on the terrace 13d. In this embodiment, the terrace 13d is provided in the second substrate region 17b of the substrate 17. The substrate 17 has a principal surface 17c on which the laser body region 15 and the pad electrodes 27 are mounted, and a back surface 17d located at the side opposite to the principal surface 17c. The laser body region 15 has the first end facet 13c. The first end facet 13c is located at a boundary 13i between the first region 13a and the second region 13b. The first end facet 13c extends in a direction of the normal to the principal surface 17c of the substrate 17. Also, the first end 13f and the second end 13g of the laser structure body 13 also extend in the direction of the normal to the principal surface 17c of the substrate 17. The first end facet 13c is formed by dry etching. With processing by dry etching, an end facet with high perpendicularity can be formed. Accordingly, by using dry etching, a high reflectivity equivalent to that of an end facet formed by cleavage is obtained. Each of quantum cascade lasers in the array structure of the quantum cascade laser 11 emits light having a wavelength in a mid-infrared wavelength region of 3 μm or larger. Even if an end facet of the laser body region 15 formed by dry etching has roughness that is typically in a range from about 50 to about 100 nm, a decrease in effective reflectivity of the end facet is relatively less because the wavelength emitted from the quantum cascade laser is relatively long as compared with the roughness of the end facet. Therefore, even if the end facet processed with dry etching has the roughness, the end facet has a high reflectivity so as to obtain excellent lasing characteristics. In addition, by using dry etching in the process of forming the end facet of the laser body region 15, the individual quantum cascade lasers in the array have uniform lasing characteristics.

With this quantum cascade laser 11, the plurality of laser waveguide structures 19 and the plurality of first electrodes 25 are arranged in the first region 13a in which the pad electrodes 27 are not formed. As a result, a distance SP between the individual laser waveguide structures 19 and a cavity length LG are independently designed regardless of the arrangement of the plurality of pad electrodes 27. Also, the pad electrodes 27 are independently arranged on the terrace 13d in the second region 13b regardless of the distance SP between the laser waveguide structures 19, the cavity length LG, and the arrangement of the plurality of first electrodes 25. The first region 13a and the second region 13b of the laser structure body 13 are arranged in the direction along the first axis Ax1. Hence, each of the pad electrodes 27 on the second region 13b is connected with one of the first electrodes 25 on the laser waveguide structures 19 in the first region 13a through one of the wiring metal bodies 29 crossing the boundary 13i between the first region 13a and the second region 13b.

In this embodiment, the quantum cascade laser 11 includes a second electrode 23 on the back surface 17d of the substrate 17. The second electrode 23 is an electrode which is common to the plurality of laser waveguide structures 19. The second electrode 23 is connected with each of the laser waveguide structures 19 through a conductive semiconductor of the substrate 17.

To avoid electrical contact between the wiring metal bodies 29 and the laser structure body 13, an insulating layer 37 is formed on surfaces of the first region 13a and the second region 13b in which the wiring metal bodies 29 are formed. In the second region 13b, the insulating layer 37 is formed on atop surface of the substrate 17, for example. Furthermore, to avoid electrical contact between the first end facet 13c and the wiring metal bodies 29, the first end facet 13c is also covered with the insulating layer 37. Also, the surfaces of the laser waveguide structures 19 are covered with the insulating layer 37. The first electrodes 25 respectively contact the upper surfaces of the laser waveguide structures 19 (for example, the contact layers 21e) through openings 37a provided in the insulating layer 37 covering the surfaces of the laser waveguide structures 19 (see FIG. 3).

Laser cavities included in the laser waveguide structures 19 are described with reference to FIGS. 1C and 1D. With reference to FIG. 1C, the laser waveguide structures 19 reach the first end facet 13c. With this quantum cascade laser 11, each of the end facets of the laser waveguide structures 19 on the first end facet 13c functions as a reflection mirror of the laser cavity in the laser waveguide structure 19. In this embodiment, the laser waveguide structures 19 reach a second end facet 13j. The laser waveguide structures 19 may have second end portions 13h located at the side opposite to the first end facet 13c. Each of the second end portions 13h functions as other reflection mirror of the laser cavity in the laser waveguide structure 19.

The laser waveguide structures 19 may have, for example, an end facet (for example, the second end facet 13j) or a distributed Bragg reflector as a reflection mirror of the laser cavity. If required, to be more specific, a coating film 35 made of dielectric or metal may be provided on the second end facet 13j to adjust the reflectivity of the end facet. With the above-described configurations, the laser waveguide structures 19 have the first end facet 13c and the second end portions 13h that serve as the reflection mirror of the laser cavity.

Referring to FIG. 1D, the laser body region 15 includes a distributed Bragg reflector region 31 and a laser semiconductor region 33. The distributed Bragg reflector region 31 and the laser semiconductor region 33 are arrayed in the direction along the first axis Ax1. The distributed Bragg reflector region 31 includes the first end facet 13c. The distributed Bragg reflector region 31 is provided between the second region 13b and the laser semiconductor region 33, and has a distributed Bragg reflection structure. With this quantum cascade laser 11, the distributed Bragg reflector region 31 serves as a reflection mirror of a laser cavity for each of the laser waveguide structures 19. The laser semiconductor region 33 includes an end facet 33a extending in the direction along the second axis Ax2 intersecting with the first axis Ax1. The end facet 33a is located at the boundary between the distributed Bragg reflector region 31 and the laser semiconductor region 33. The laser semiconductor region 33 has a second end portion 33b at the side opposite to the end facet 33a. The second end portion 33b serves as another reflection mirror of the laser cavity for each of the laser waveguide structures 19, and may have a cleaved end facet (for example, the second end facet 13j) or a distributed Bragg reflection structure.

As shown in FIG. 1D, the distributed Bragg reflector region 31 includes a single or a plurality of high refractive index portions 31a and 31b extending in the direction of the normal to the principal surface 17c of the substrate 17. The high refractive index portions 31a and 31b are isolated from the end facet 33a of the laser waveguide structures 19 in the laser semiconductor region 33. In this embodiment, the high refractive index portions 31a and 31b of the distributed Bragg reflector region 31 are periodically arrayed so as to configure the distributed Bragg reflection structure. Specifically, the high refractive index portions 31a and 31b have a wall made of semiconductor (hereinafter referred to as semiconductor wall). A low refractive index portion made of a material with a lower refractive index than those of the high refractive index portions 31a and 31b is provided between the high refractive index portions 31a and 31b, between the high refractive index portion 31b and the semiconductor end facet 33a, and between the high refractive index portion 31a and the first end facet 13c. The spaces between the two high refractive index portions 31a and 31b, between the high refractive index portion 31b and the semiconductor end facet 33a, and between the high refractive index portion 31a and the first end facet 13c are filled with the material with the low refractive index to decrease the step between the high refractive index portion and the low refractive index portion. Accordingly, the first electrodes 25 may extend on the upper surface of the distributed Bragg reflector region 31 and reach an upper edge of the first end facet 13c. To increase the reflectivity of the distributed Bragg reflector region 31, the thicknesses of the high refractive index portions 31a and 31b, the thickness of the low refractive index portion between the high refractive index portions 31a and 31b, and the thickness of the low refractive index portion between the high refractive index portion 31b and the end facet 33a in the direction along the first axis Ax1 each are set at an odd multiple of reference width $\lambda/(4 \times n)$ in the extending direction (the direction along the first axis Ax1) of the laser waveguide structures 19 (in this expression, "$\lambda$" is a lasing wavelength in vacuum of the quantum cascade laser and "n" is an effective refractive index of each of the high refractive index portions and the low refractive index portions at this lasing wavelength). Specifically, the thicknesses of the high refractive index portions 31a and 31b, the thickness of the low refractive index portion between the high refractive index portions 31a and 31b, and the thickness of the low refractive index portion between the high refractive index portion 31b and the end facet 33a each are set at, for example, $\lambda/(4 \times n)$ or $3 \times \lambda/(4 \times n)$. By using the high refractive index portions and low refractive index portions with the aforementioned configuration, the distributed Bragg reflector region 31 functions as a high reflection mirror at rear end facets of the laser waveguide structures 19, and contributes to improvement in characteristics of the quantum cascade laser, such as a decrease in threshold current and an increase in optical output. The number of high refractive index portions in the distributed Bragg reflector region 31 may be any number. As the number increases, a higher reflectivity can be obtained.

FIGS. 1E, 1F, and 1G schematically show cross sections taken along line I-I in FIGS. 1C and 1D, in a region in which the laser waveguide structures 19 are formed. Specific forms of the wiring metal bodies 29 that connect the first electrodes 25 respectively with the pad electrodes 27 are described with reference to FIGS. 1E, 1F, and 1G. These figures show different forms of wiring metal bodies 29. Each wiring metal body 29 includes a first portion 29a and a second portion 29b. The first portion 29a is provided on the terrace 13d. The second portion 29b is provided on the first end facet 13c.

As shown in FIG. 1E, a first end of the second portion 29b is connected with the first portion 29a, and the first portion 29a is connected with the pad electrode 27. A second end of the second portion 29b is connected with the first electrode 25. The second portion 29b is provided on an end facet of the core layer 21a of the laser waveguide structure 19 at the first end facet 13c, and functions as a high-reflective mirror of the laser waveguide structure 19. Since this second portion 29b functions as the high-reflective mirror, improvement in characteristics of the quantum cascade laser 11, such as a decrease in threshold current and an increase in optical output, is obtained. As described above, with this structure, the wiring metal body 29 also functions as a high-reflective rear-end-facet mirror of the laser waveguide structure 19. In the embodiment, the wiring metal body 29 and the second portion 29b are formed simultaneously in a manufacturing process on a wafer. Hence, the manufacturing process can be simplified as compared with an array structure of related art in which an upper wiring electrode and a high-reflective coating film on the rear-end-facet are formed by different processes. As a result, the productivity is increased, and the cost is decreased. To allow the second portion 29b to effectively function as the high reflection mirror, the width of the second portion 29b in the direction along the second axis Ax2 is desirably larger than the width of the laser waveguide structure 19 so that light propagating in the laser waveguide structure 19 may be entirely reflected by the second portion 29b.

As shown in FIG. 1F, the second portion 29b is provided on the first end facet 13c, in a different area separated from the core end facet of the laser waveguide structure 19. Hence, the second portion 29b is not used as a reflection mirror of a laser cavity for the laser waveguide structure 19. The second portion 29b is provided to bypass the core end facet of the laser waveguide structure 19. To provide the second portion 29b having the bypass structure as described above, the wiring metal body 29 has a third portion (a third portion "29c" shown in FIGS. 7 and 8) provided on the laser body region 15 to connect the second portion 29b with the first electrode 25. In this form, the first end of the second portion 29b is connected with the pad electrode 27 through the first portion 29a, and the second end of the second portion 29b is connected with the first electrode 25 through the third portion 29c on the laser body region 15.

As show in FIG. 1G, the second portion 29b is provided on the first end facet 13c, at a position separated from the core end facet of the laser waveguide structure 19, and is not used as a reflection mirror of a laser cavity for the laser waveguide structure 19. However, a metal layer 39 different from the wiring metal body 29 is provided as a reflection mirror on the core end facet of the laser waveguide structure 19. The metal layer 39 is isolated from the second portion 29b on the first end facet 13c. An end portion ED of the metal layer 39 is located on the first end facet 13c or the terrace 13d. Accordingly, the metal layer 39 is not used as a wiring layer for connecting the first electrode 25 with the pad electrode 27. Hence, the second portion 29b bypasses the core end facet of the laser waveguide structure 19 and is separated from the metal layer 39. To provide the second portion 29b having the bypass structure as described above, the wiring metal body 29 has the third portion (the third portion "29c" shown in FIGS. 7 and 8) provided on the laser body region 15 to connect the second portion 29b with the first electrode 25. In this form, the first end of the second portion 29b is connected with the pad electrode 27 through the first portion 29a, and the second end of the second portion 29b is connected with the first electrode 25 through the third portion 29c on the laser body region 15.

With the quantum cascade laser 11, each of the pad electrodes 27 is connected with one of the first electrodes 25 through the wiring metal body 29 including the first portion 29a and the second portion 29b (if required, the third portion 29c).

Continuing from the above description, some specific examples are described. In this description, for easier understanding, the reference signs for the members shown in FIGS. 1A to 1G are used if possible.

EXAMPLE 1

Figure 2B:
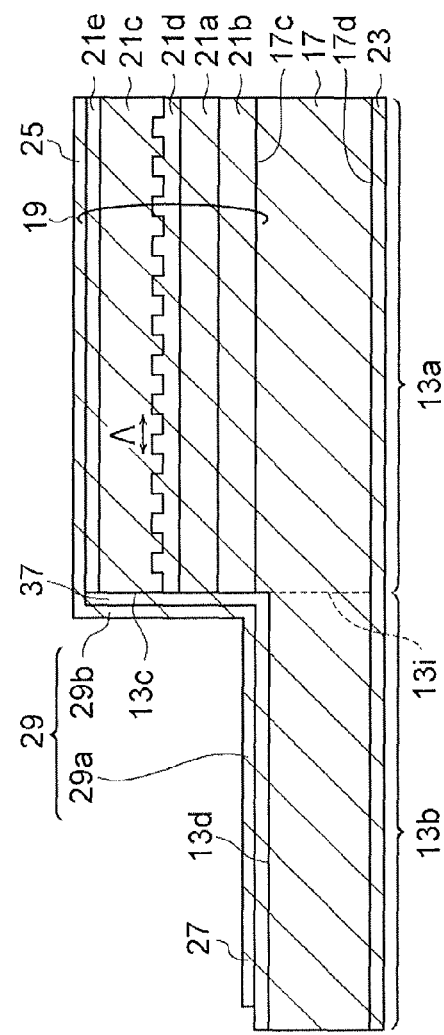

FIGS. 2A and 2B are drawing showing a quantum cascade laser according to Example 1. FIG. 2A is a plan view showing the quantum cascade laser according to Example 1. FIG. 2B shows a cross section taken along line IIb-IIb shown in FIG. 2A. Referring to FIG. 2A, the pad electrode 27 is connected with a first end of the first portion 29a of the wiring metal body 29 on the terrace 13d. The second end of the second portion 29b of the wiring metal body 29 on the first end facet 13c is connected with a first end of the first electrode 25 on the laser waveguide structure 19. Hence, the second portion 29b of the wiring metal body 29 extends on the first end facet 13c (to be more specific, the core end facet of the core layer 21a). With the quantum cascade laser 11 according to Example 1, the second portion 29b of the wiring metal body 29 has a portion provided on the core end facet of the core layer 21a. Hence, the second portion 29b functions as a high reflection mirror of the laser cavity. The reflectivity of the first end facet 13c of the laser waveguide structure 19 is easily increased by forming the second portion 29b of the wiring metal body 29 on the first end facet 13c. In the mid-infrared quantum cascade laser, the width of the laser waveguide structure 19 in the direction along the second axis Ax2 orthogonal to the first axis Ax1 is normally set at about 10 µm or smaller so that the lateral transverse mode of lasing light in the direction along the second axis Ax2 is a single mode. Therefore, the width of the second portion 29b of the wiring metal body 29 in the direction along the second axis Ax2 is preferably 20 µm or larger for example. Accordingly, the second portion 29b may reflect significant portions of laser light propagating through the laser waveguide structure 19. Therefore, the second portion 29b effectively functions as the high reflection mirror. The second portion 29b is preferably separated from the adjacent second portion 29b by, for example, 30 µm or more in the direction along the second axis Ax2. If the separation is provided by the above-described amount, electrical insulation between the adjacent laser waveguide structures 19 can be ensured, and an operation failure due to electrical crosstalk or insulation breakdown can be restricted. The quantum cascade laser 11 of Example 1 includes the four laser waveguide structures 19. In this device structure, the pad electrodes 27 are separated from the first region 13a in which the laser waveguide structures 19 are formed, and are collected in the second region 13b. Accordingly, the four laser waveguide structures 19 may be arrayed while the distance SP between the adjacent waveguides is determined at a desirable value without restriction by the arrangement and size of the pad electrodes 27. Also, for the same reason, the cavity length LG may be provided at a desirable size without restriction by the arrangement and size of the pad electrodes 27. As shown in FIGS. 2A and 2B, the wiring metal body 29 serves as a reflection mirror having a high reflectivity at the laser waveguide structure 19 by forming the second portion 29b on the first end facet 13c.

Also, referring to FIG. 2B, a diffraction grating in which recesses and protrusions are periodically arrayed with a period A is formed in the diffraction grating layer 21d in the direction along the first axis Ax1. Light with a Bragg wavelength corresponding to the period A is selectively reflected by the diffraction grating, and is amplified in the laser waveguide structure 19. As a result, lasing light with a single longitudinal mode is emitted from the second end facet 13j located at the side opposite to the first end facet 13c. Also, by setting properly different periods A in the respective laser waveguide structures 19, different Bragg wavelengths corresponding to the periods A of the diffraction gratings are emitted from the laser waveguide structures 19. Hence, in the individual laser waveguide structures 19, operations with different lasing wavelengths may be provided. As a result, the quantum cascade laser 11 operates as a light source in a wide wavelength band having a plurality of lasing wavelengths.

Figure 3:
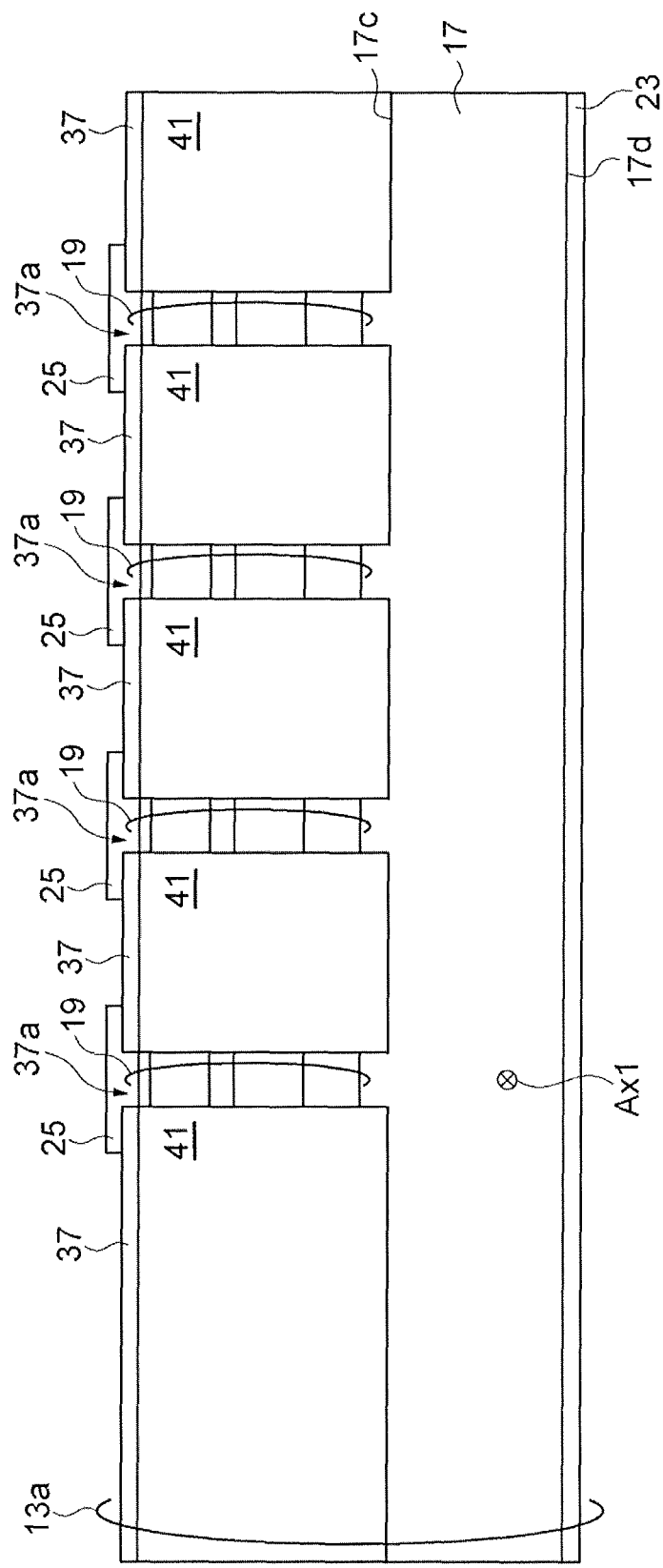
FIG. 3 is a drawing showing a cross section taken along line III-III shown in FIG. 2A.

FIG. 3 shows a cross section taken along line III-III shown in FIG. 2A. The laser body region 15 has a buried-heterostructure (BH). That is, the laser body region 15 includes the laser waveguide structures 19 etched in mesa shape, and buried regions 41 embedding the side surfaces of the laser waveguide structures 19. The buried region 41 includes, for example, an undoped semiconductor or semi-insulating semiconductor. The buried regions 41 are disposed between the laser waveguide structures 19, and the laser waveguide structures 19 are insulated from each other. The openings 37a of the insulating layer 37 are formed on the upper surfaces of the laser waveguide structures 19. The first electrodes 25 contact the upper surfaces of the laser waveguide structures 19 through the openings 37a. The second electrode 23 is formed on the back surface 17d of the substrate 17.

Figure 4:
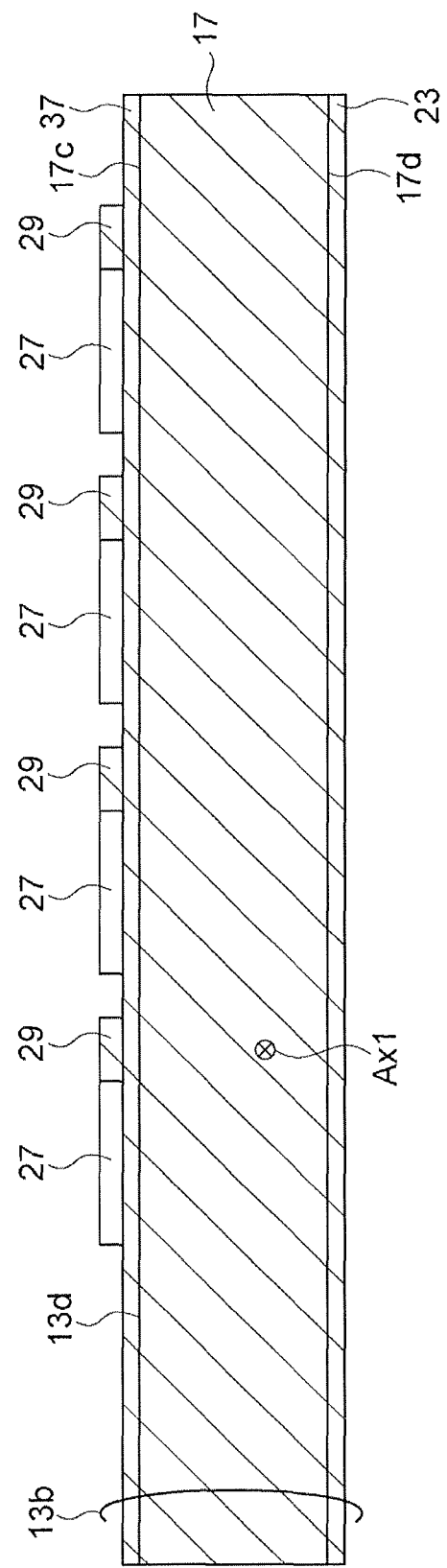
FIG. 4 is a drawing showing a cross section taken along line IV-IV shown in FIG. 2A.

FIG. 4 shows a cross section taken along line IV-IV shown in FIG. 2A. The four pad electrodes 27 are formed on the terrace 13d. These pad electrodes 27 are respectively connected with the wiring metal bodies 29 (29a). Also, the insulating layer 37 is formed on the principal surface 17c of the substrate 17 in the second region 13b. The insulating layer 37 insulates the pad electrodes 27 from the substrate 17. The second electrode 23 is formed on the back surface 17d of the substrate 17.

Figure 5:
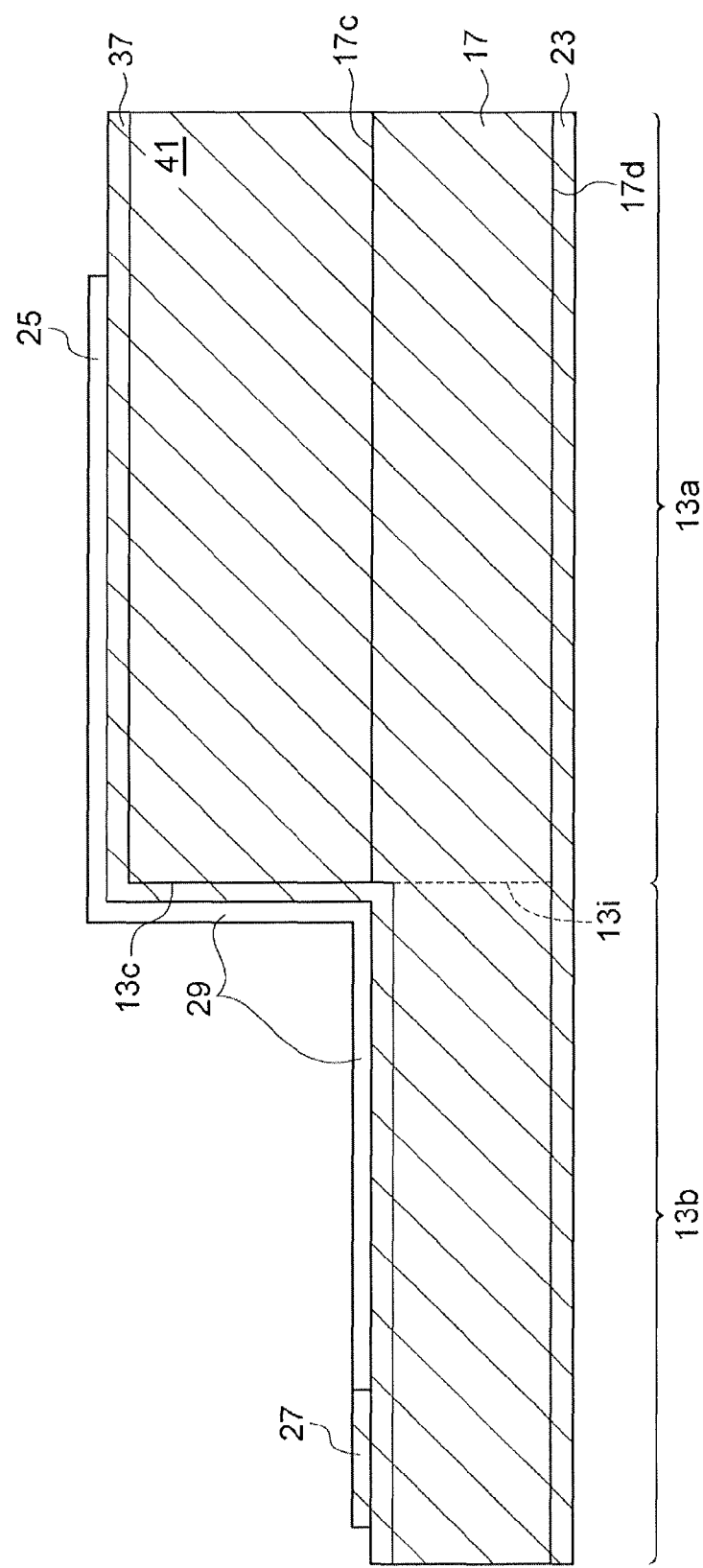
FIG. 5 is a drawing showing a cross section taken along line V-V shown in FIG. 2A.

FIG. 5 shows a cross section taken along line V-V shown in FIG. 2A. The buried region 41 also reaches the first end facet 13c. In the laser body region 15, the surface of the buried region 41 of the laser waveguide structures 19 and the first end facet 13c are covered with the insulating layer 37. The insulating layer 37 is formed on the principal surface 17c in the second region 13b. The wiring metal bodies 29 and the pad electrodes 27 extend on the insulating layer 37. The insulating layer 37 insulates the first electrodes 25, the pad electrodes 27, and the wiring metal bodies 29 from the substrate 17, the first end facet 13c, and the buried region 41. The second electrode 23 is formed on the back surface 17d of the substrate 17.

Figure 6:
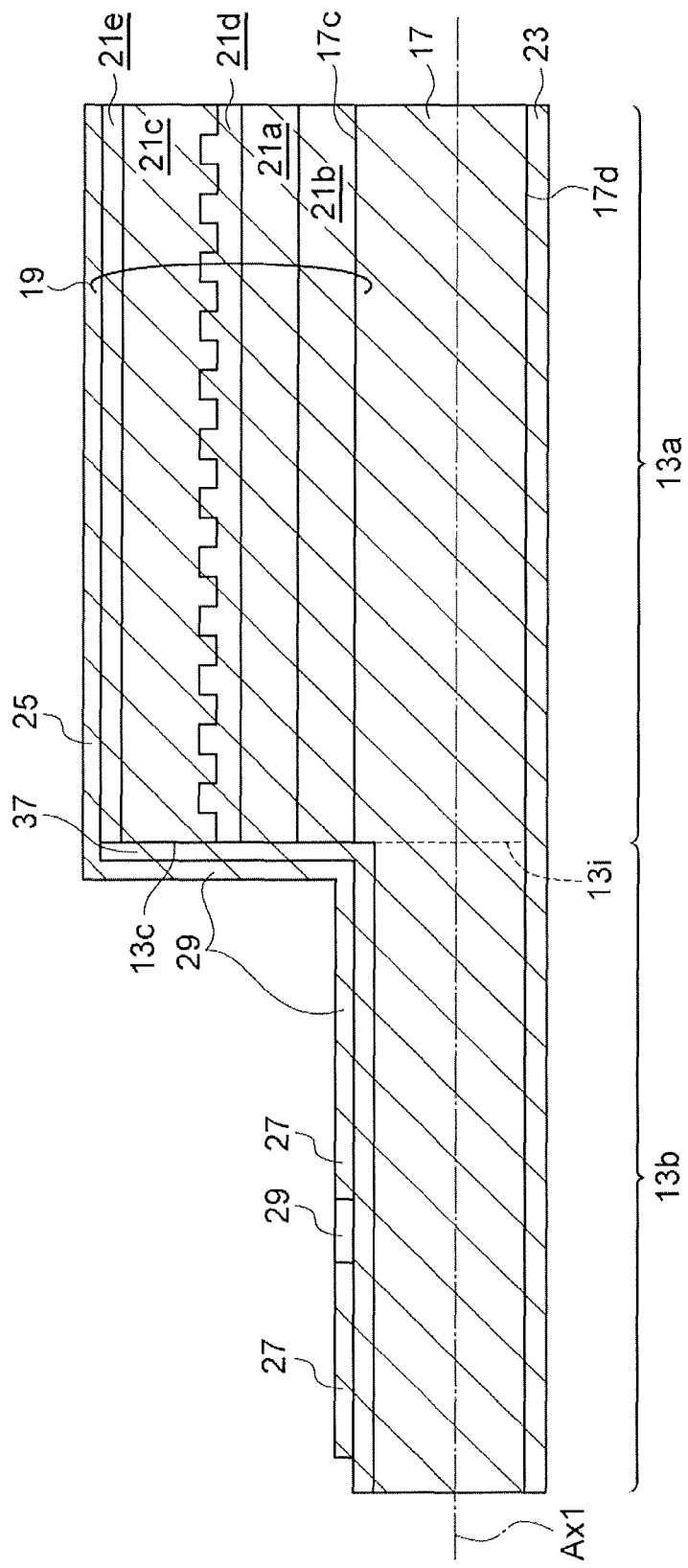
FIG. 6 is a drawing showing a cross section taken along line VI-VI shown in FIG. 2A.

FIG. 6 shows a cross section taken along line VI-VI shown in FIG. 2A. As shown in FIGS. 6 and 2A, the pad electrodes 27 corresponding to the individual laser waveguide structures 19 are arrayed in the direction along the first axis Ax1. Accordingly, the chip size of the quantum cascade laser may be reduced.

EXAMPLE 2

FIGS. 7A and 7B are drawings showing a quantum cascade laser according to Example 2. FIG. 7A is a plan view showing the quantum cascade laser according to Example 2. FIG. 7B shows a cross section taken along line VIIb-VIIb shown in FIG. 7A. Referring to FIG. 7A, the quantum cascade laser 11 includes the three laser waveguide structures 19. The pad electrodes 27 are connected with the first ends of the first portions 29a of the wiring metal bodies 29 on the terrace 13d. The second ends of the second portions 29b of the wiring metal bodies 29 on the first end facet 13c are connected with first ends of the third portions 29c of the wiring metal bodies 29 on the laser body region 15. Also, second ends of the third portions 29c are connected with the first electrodes 25. The second portions 29b are provided to bypass the core end facets of the laser waveguide structures 19. To provide the second portions 29b having the bypass structures as described above, the wiring metal bodies 29 have the third portions 29c provided on the laser body region 15 to connect the second portions 29b with the first electrodes 25. As shown in FIGS. 7A and 7B, with the quantum cascade laser according to Example 2, the first end facet 13c functions as a reflection mirror of the laser cavity included in each of the laser waveguide structures 19. The second portions 29b are provided on the first end facet 13c, at positions separated from the end facets of the laser waveguide structures 19 (to be more specific, the core end facets of the core layers 21a). Therefore, the second portions 29b do not disturb incidence and/or emission of light on and/or from the core end facets of the core layers 21a at the first end facet 13c. As a result, emission light from the first end facet 13c of each laser waveguide structure 19 may be used as monitor light for monitoring the oscillation state of the quantum cascade laser in each laser waveguide structure 19. With Example 2, the pad electrodes 27 are separated from the first region 13a in which the laser waveguide structures 19 are formed, and are collected in the second region 13b. Hence, the cavity length LG of the three laser waveguide structures 19 may have a desirable size without restriction by the arrangement and size of the pad electrodes 27. Also, for the same reason, the distance SP between the adjacent laser waveguide structures 19 may be determined with a desirable value without restriction by the arrangement and size of the pad electrodes 27 except for an area in which the third portions 29c extend for lead-out. The quantum cascade laser according to Example 2 is similar to the quantum cascade laser according to Example 1 except for the arrangement of the wiring metal bodies 29.

EXAMPLE 3

Figure 8A:
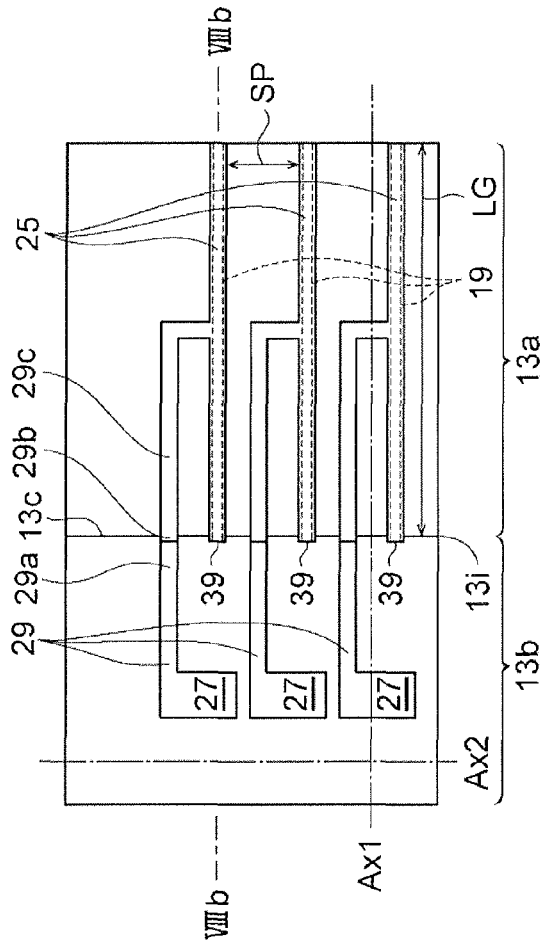
FIGS. 8A and 8B are drawings showing a quantum cascade laser according to Example 3.
Figure 8B:
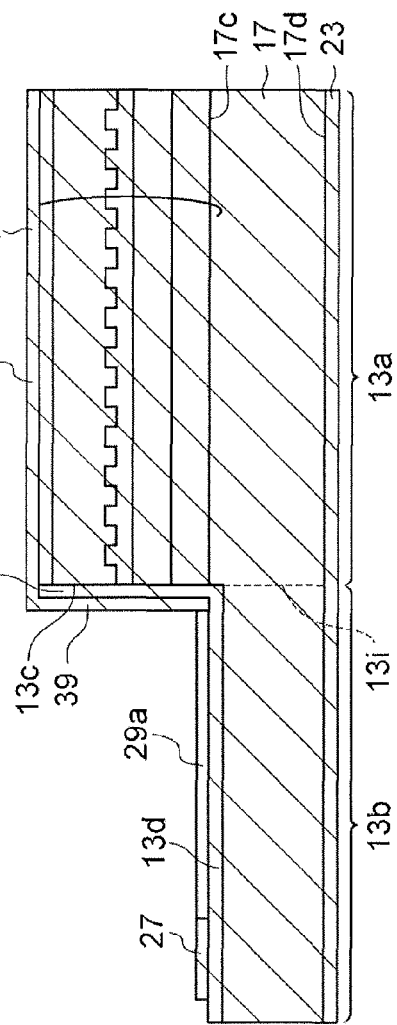

FIGS. 8A and 8B are drawings showing a quantum cascade laser according to Example 3. FIG. 8A is a plan view showing the quantum cascade laser according to Example 3. FIG. 8B shows a cross section taken along line VIIIb-VIIIb shown in FIG. 8A. Referring to FIG. 8A, the quantum cascade laser 11 of Example 3 includes the three laser waveguide structures 19. The second portions 29b are provided on the first end facet 13c to bypass the end facets of the laser waveguide structures 19, or more specifically, the core end facets of the core layers 21a. To provide the second portions 29b having the bypass structures as described above, the wiring metal bodies 29 have the third portions 29c provided on the laser body region 15 to connect the second portions 29b with the first electrodes 25. The second portions 29b are provided on the first end facets 13c, at positions separated from the core end facets of the laser waveguide structures 19, and are not used as a reflection mirror of the laser cavity included in each of the laser waveguide structures 19. Hence, this structure can prevent the second portions 29b from disturbing the reflection by the reflection mirrors of the laser waveguide structures 19 on the first end facet 13c. The pad electrodes 27 are connected with the first ends of the second portions 29b through the first portions 29a of the wiring metal bodies 29 on the terrace 13d. The second ends of the second portions 29b of the wiring metal bodies 29 on the first end facet 13c are connected with the first ends of the third portions 29c of the wiring metal bodies 29 on the laser body region 15. The second ends of the third portions 29c are connected with the first electrodes 25. As shown in FIGS. 8A and 8B, metal layers 39 different from the wiring metal bodies 29 are provided on the core end facets of the laser waveguide structures 19, as a high reflection mirror of the laser cavity. The metal layers 39 extend from the upper end to the lower end of the first end facet 13c, and is isolated from the second portions 29b on the first end facet 13c. The metal layers 39 extend on the core end facets of the core layers 21a. Hence, the reflectivity of the first end facet 13c serving as a reflection mirror of the laser cavity in the laser waveguide structures 19 is increased by forming the meal layers 39. The metal layers 39 function as high reflection mirrors at rear end facets of the laser waveguide structures 19, and contribute to improvement in characteristics of the quantum cascade laser, such as a decrease in threshold current and an increase in optical output. Also, in this structure, the wiring metal bodies 29 and the metal layers 39 may be simultaneously formed in the manufacturing process on the wafer. Hence, the manufacturing process can be simplified as compared with an array structure of related art in which an upper wiring electrode and a coating film on the rear-end-facet are formed by different processes. As a result, the productivity is increased, and the cost is decreased. As described above, the width of each laser waveguide structure 19 in the direction along the second axis Ax2 is normally set at about 10 μm or smaller so as to operate with a single transverse mode in the direction along the second axis Ax2. The width of each metal layer 39 in this direction is preferably, for example, 20 μm or larger. Accordingly, significant portions of laser light propagating through the laser waveguide structures 19 may be reflected by the metal layers 39. Hence, the metal layers 39 effectively function as high reflection mirrors. With the quantum cascade laser according to Example 3, the pad electrodes 27 are separated from the first region 13a in which the laser waveguide structures 19 are formed, and are collected in the second region 13b. For the three laser waveguide structures 19, the cavity length LG may have a desirable size without restriction by the arrangement and size of the pad electrodes 27. Also, for the same reason, the distance SP between the adjacent laser waveguide structures 19 may be arrayed with a desirable value without restriction by the arrangement and size of the pad electrodes 27 except for the area in which the third portions 29c extend for lead-out. The quantum cascade laser according to Example 3 is similar to the quantum cascade laser according to Example 2 except for the addition of the metal layers 39.

Figure 9A:
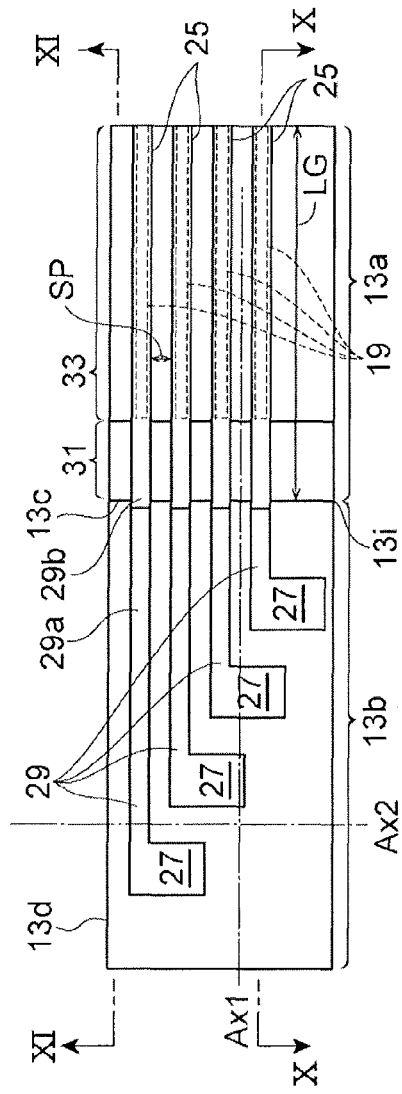
FIGS. 9A and 9B are plan views showing some examples relating to shapes of wiring metal bodies of quantum cascade lasers according to Examples 4 and 5.
Figure 9B:
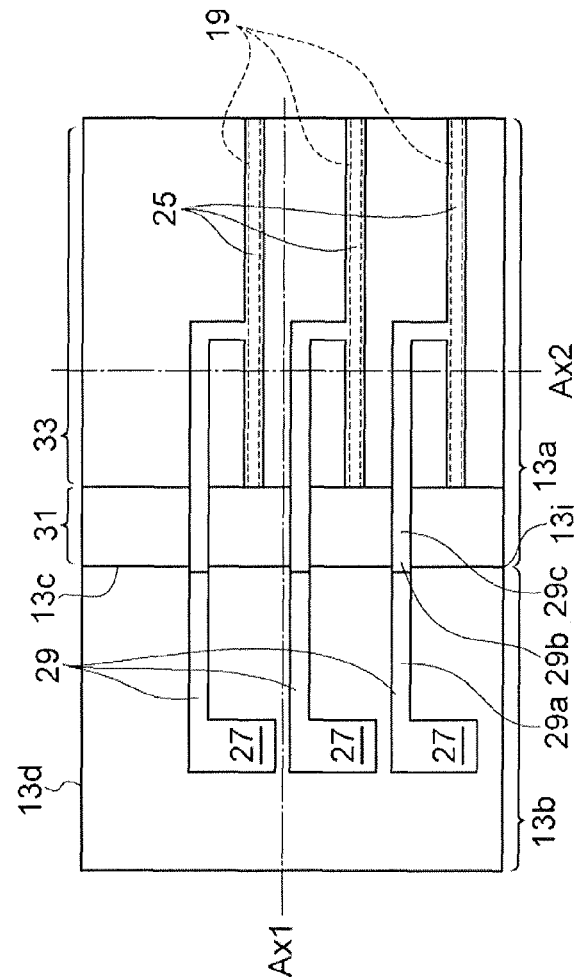

FIGS. 9A and 9B are plan views showing quantum cascade lasers of some examples relating to the shapes of the wiring metal bodies 29.

EXAMPLE 4

FIG. 9A is a plan view showing a quantum cascade laser according to Example 4. Referring to FIG. 9A, the pad electrodes 27 are connected with the first ends of the first portions 29a of the wiring metal bodies 29 on the terrace 13d. The second portions 29b of the wiring metal bodies 29 and the first electrodes 25 respectively extend on the first end facet 13c and the upper surface of the distributed Bragg reflector region 31. The second portions 29b of the wiring metal bodies 29 extend on the first end facet 13c (to be more specific, an end facet of the distributed Bragg reflector region 31). The second ends of the second portions 29b are connected with the first ends of the first electrodes 25 on the laser waveguide structures 19. Each of the second portions 29b is provided on the end facet of the corresponding laser waveguide structure 19 at the first end facet 13c, and functions as a high reflection mirror of laser cavity included in each of the laser waveguide structures 19. Hence, in this structure, both the distributed Bragg reflector region 31 and the second portions 29b contribute to an increase in reflectivity of the rear end facets of the laser waveguide structures 19. Accordingly, improvement in characteristics of the quantum cascade laser, such as a decrease in threshold current and an increase in optical output, can be attained more easily. The pad electrodes 27 corresponding to the individual laser waveguide structures 19 are arrayed in a step form in the direction along the first axis Ax1. Accordingly, the chip size of the quantum cascade laser can be reduced. With the quantum cascade laser according to Example 4, the four laser waveguide structures 19 are included, and the pad electrodes 27 are separated from the first region 13a in which the laser waveguide structures 19 are formed, and are collected in the second region 13b. Accordingly, the distance SP between the laser waveguide structures 19 and the cavity length LG may be set at desirable values without restriction by the arrangement and size of the pad electrodes 27.

Figure 10:
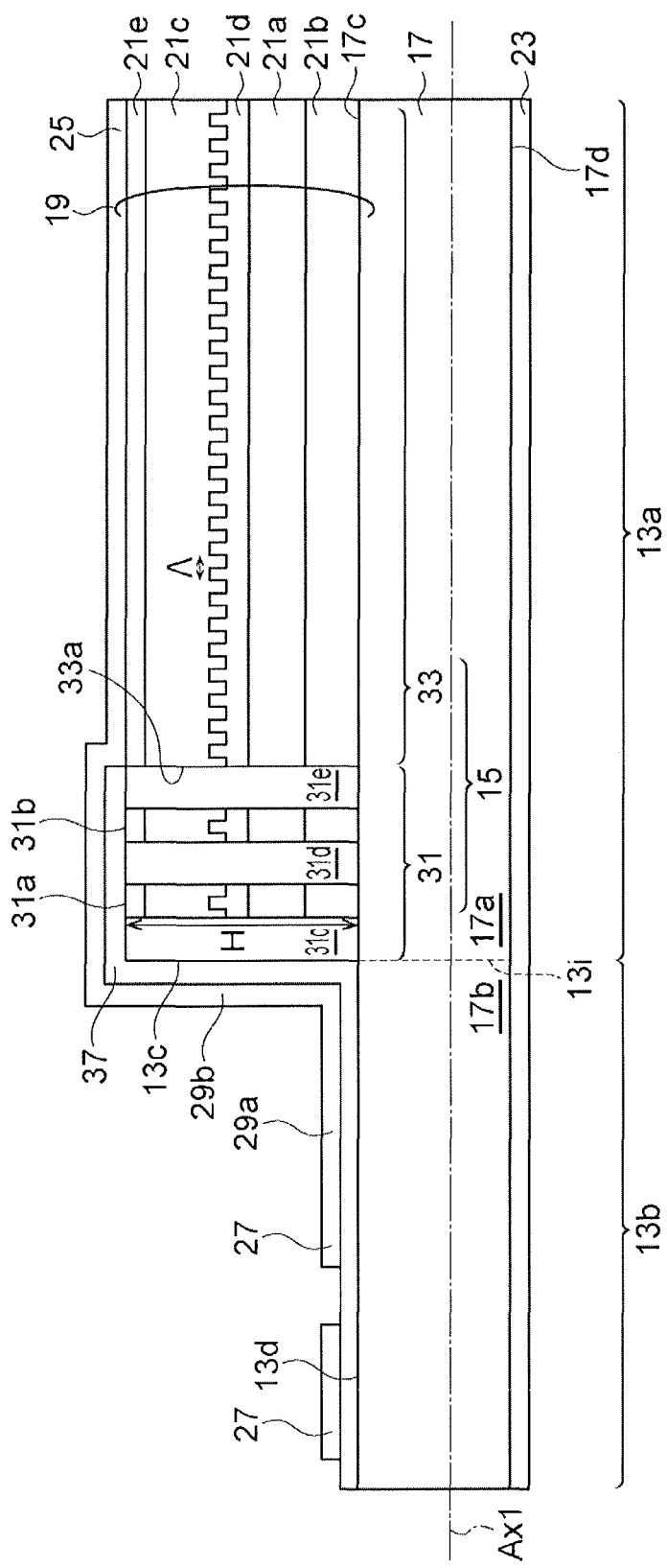
FIG. 10 is a drawing showing a cross section taken along line X-X shown in FIG. 9A.
Figure 11:
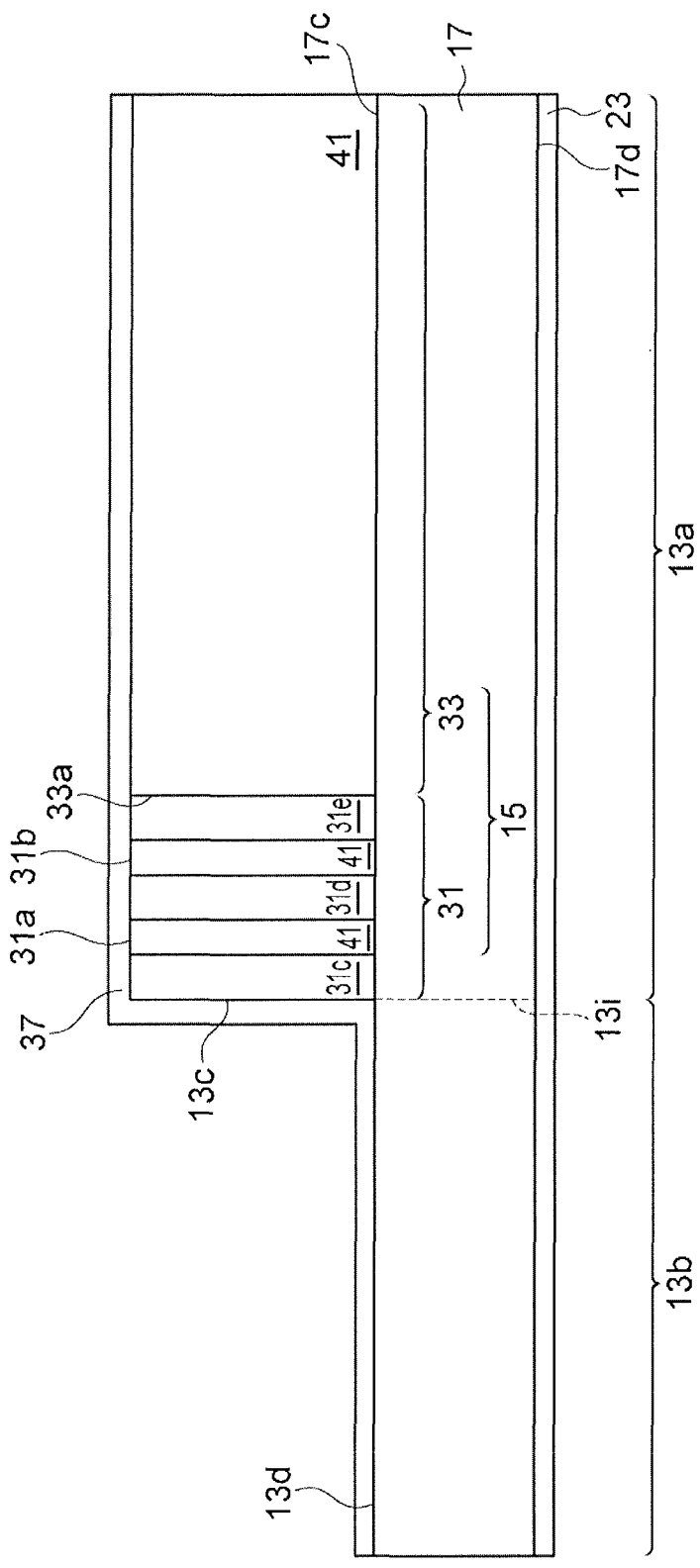
FIG. 11 is a drawing showing a cross section taken along line XI-XI shown in FIG. 9A.

FIG. 10 shows a cross section taken along line X-X shown in FIG. 9A. FIG. 11 shows a cross section taken along line XI-XI shown in FIG. 9A. As shown in FIGS. 9A, 10, and 11, the first region 13a of the laser body region 15 includes the distributed Bragg reflector region 31 and the laser semiconductor region 33. The laser semiconductor region 33 includes the laser waveguide structures 19 and the buried regions 41 embedding the side surfaces of the laser waveguide structures 19. The buried region 41 extends between the adjacent laser waveguide structures 19 along the laser waveguide structures 19. The laser semiconductor region 33 and the distributed Bragg reflector region 31 in the first region 13a, and the second region 13b are sequentially arrayed in the extending direction of the laser waveguide structures 19 (the direction along the first axis Ax1). The distributed Bragg reflector region 31 includes the first end facet 13c. The quantum cascade laser of Example 4 includes the four laser waveguide structures 19. The laser waveguide structures 19 are arrayed with a desirable value of the distance SP. Further, the first region 13a may be provided with a desirable size of the cavity length LG.

In the laser body region 15, the surface of the buried region 41, the upper surface of the distributed Bragg reflector region 31, and the first end facet 13c are covered with the insulating layer 37. Also, the insulating layer 37 is formed on the principal surface 17c in the second region 13b. The insulating layer 37 insulates the pad electrodes 27 and the wiring metal bodies 29 from the substrate 17, the first end facet 13c, the distributed Bragg reflector region 31, and the buried region 41. The second electrode 23 is formed on the back surface 17d of the substrate 17.

The distributed Bragg reflector region 31 includes high refractive index portions 31a and 31b configured of semiconductor walls, and low refractive index portions 31c, 31d, and 31e configured of a material with a lower refractive index than that of the semiconductor walls. The high refractive index portions 31a and 31b, and the low refractive index portions 31c, 31d, and 31e are made of materials that transmit light having the emission wavelength of the quantum cascade laser. The high refractive index portions 31a and 31b, and the low refractive index portions 31c, 31d, and 31e are alternately arrayed in the extending direction of the laser waveguide structures 19 (the direction along the first axis Ax1), and configure a distributed Bragg reflector structure. The high refractive index portions 31a and 31b, and the low refractive index portions 31c, 31d, and 31e extend in the direction intersecting with the extending direction of the laser waveguide structures 19 (the direction along the second axis Ax2). Specifically, as the cross sectional structure in the direction along the second axis Ax2, the semiconductor walls of the high refractive index portions 31a and 31b are formed of the buried region 41 that also embeds the laser waveguide structure 19 so as to form a buried-heterostructure in the laser body region 15 shown in FIG. 3. The low refractive index portions 31c, 31d, and 31e are made of a dielectric material to form a dielectric wall. The dielectric material of the low refractive index portions 31c, 31d, and 31e may include benzocyclobutene (BCB) resin, polyimide resin, silicon dioxide ($SiO_2$), silicon nitride (SiN), silicon oxy-nitride (SiON), or alumina.

EXAMPLE 5

FIG. 9B is a plan view showing a quantum cascade laser according to Example 5. The quantum cascade laser according to Example 5 has a configuration similar to the quantum cascade laser according to Example 4 except for the arrangement of the wiring metal bodies 29. The quantum cascade laser of Example 5 includes the three laser waveguide structures 19. The pad electrodes 27 are connected with the first ends of the first portions 29a of the wiring metal bodies 29 on the terrace 13d. The second ends of the first portions 29a are connected with the first ends of the second portions 29b on the first end facet 13c. The second ends of the second portions 29b are connected with the first ends of the third portions 29c of the wiring metal bodies 29 on the laser body region 15. The second ends of the third portions 29c are connected with the first electrodes 25 on the laser semiconductor region 33. The second portions 29b are provided to bypass the core end facets of the laser waveguide structures 19. To provide the second portions 29b having the bypass structures as described above, the wiring metal bodies 29 have the third portions 29c provided on the laser body region 15 to connect the second portions 29b with the first electrodes 25. With the quantum cascade laser according to Example 5, the second portions 29b of the wiring metal bodies 29 are separated from the core end facets of the core layers 21a on the first end facet 13c. Hence, the second portions 29b do not disturb incidence and/or emission of light on and/or from the core end facets of the core layers 21a. Therefore, emission light from the first end facet 13c of each laser waveguide structure 19 may be used as a monitor light for monitoring the oscillation state of the quantum cascade laser in each laser waveguide structure 19. Also in the structure of this example, the pad electrodes 27 are separated from the first region 13a in which the laser waveguide structures 19 are formed, and are collected in the second region 13b. Hence, for the three laser waveguide structures 19, the cavity length LG may have a desirable size without restriction by the arrangement and size of the pad electrodes 27. Also, for the same reason, the distance SP between the adjacent laser waveguide structures 19 may be adjusted to a desirable value without restriction by the arrangement and size of the pad electrodes 27 except for the area in which the third portions 29c extend for lead-out.

Figure 12A:
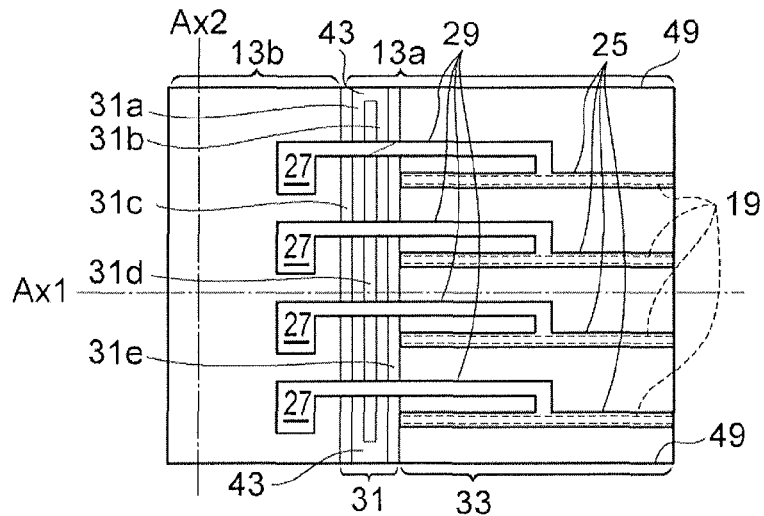
FIGS. 12A, 12B, and 12C are plan views showing some examples relating to distributed Bragg reflector regions of quantum cascade lasers according to Examples 6, 7, and 8.
Figure 12B:
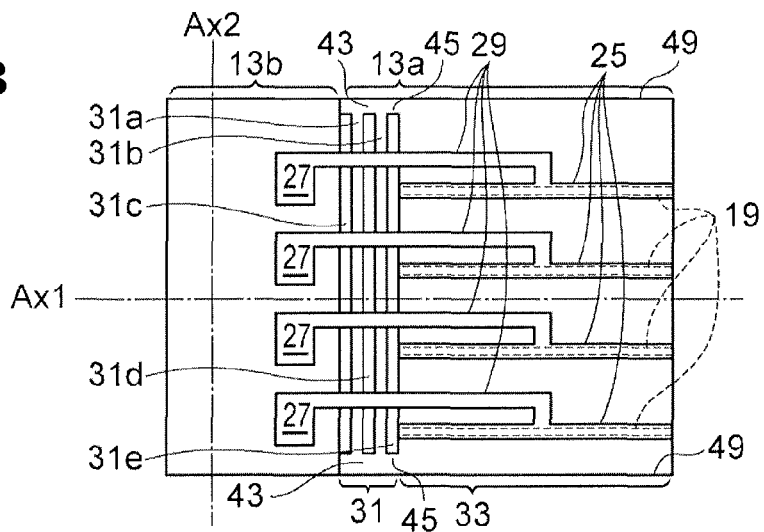
Figure 12C:
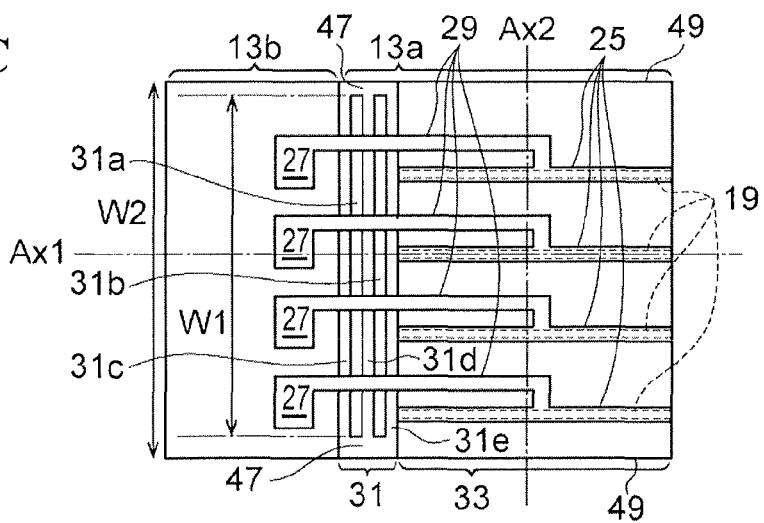

FIGS. 12A, 12B, and 12C are plan views showing quantum cascade lasers of some examples relating to the distributed Bragg reflector region 31. The device structure shown in these drawings are similar to the configuration shown in FIG. 9B except for the structure of the distributed Bragg reflector region 31.

EXAMPLE 6

Referring to FIG. 12A, the distributed Bragg reflector region 31 includes reinforcement walls 43 that connect the high refractive index portions 31a and 31b with each other. In this example, the reinforcement walls 43 extend along side edges 49 of the semiconductor chip of the quantum cascade laser 11. The reinforcement walls 43 integrate the high refractive index portions 31a and 31b, and reinforce the mechanical strength of the high refractive index portions. Arrangement of the reinforcement walls 43 is not limited to the ends of the high refractive index portions 31a and 31b (the side edges 49 of the semiconductor chip), and if required, the reinforcement walls 43 may be connected in any region of the high refractive index portions 31a and 31b. The reinforcement walls 43 are formed of, for example, the buried region 41. In particular, when the reinforcement walls 43 and the regions in the high refractive index portions 31a and 31b connected with the reinforcement walls 43 are formed of the same buried region 41 made of, for example, iron (Fe)-doped indium phosphide (InP), these regions become an integrated uniform structure without a discontinuity in terms of the crystal level. Hence, the mechanical strength of the high refractive index portions is effectively increased. Also, since these regions may be simultaneously formed of the same material, the manufacturing processing can be simplified. However, the material of the reinforcement walls 43 is not limited thereto, and if required, any one of other desirable materials having an effect of improving the mechanical strength of the high refractive index portions, for example, a material other than a semiconductor may be used. It is to be noted that all the plurality of high refractive index portions may not be necessarily connected by the reinforcement walls 43. For example, at least two of the high refractive index portions may be connected by the reinforcement walls 43, and hence integrated. In this case, the mechanical strength of the high refractive index portions may be also increased by adding the reinforcement wall 43.

EXAMPLE 7

Referring to FIG. 12B, the distributed Bragg reflector region 31 includes connection walls 45 that connect the high refractive index portion 31b with the laser semiconductor region 33. The connection walls 45 integrate the high refractive index portion 31b with the laser semiconductor region 33, and reinforce the mechanical strength of the high refractive index portion. In this example, the connection walls 45 are connected with the reinforcement walls 43. The connection walls 45 are extension portions provided to extend from the laser semiconductor region 33. Arrangement of the connection walls 45 is not limited to the side edges 49 of the semiconductor chip (the ends of the high refractive index portion 31b), and if required, the connection walls 45 may be connected to any region of the high refractive index portions 31b. The connection walls 45 are formed of, for example, the buried region 41. In particular, when the connection walls 45, the regions of the high refractive index portion 31b connected with the connection walls 45, and the regions of the laser semiconductor region 33 connected with the connection walls 45 are formed of the same buried region 41 made of, for example, Fe-doped InP, these regions have an integrated uniform structure without a discontinuity in terms of the crystal level. Hence, the mechanical strength of the high refractive index portions may be effectively increased. Also, since these regions are simultaneously formed of the same material for the buried region 41, the manufacturing processing can be simplified. However, the material of the connection walls 45 is not limited thereto, and if required, any one of other desirable materials having an effect of improving the mechanical strength of the high refractive index portions, for example, a material other than a semiconductor may be used. In this example, the structure is shown in which both the reinforcement walls 43 and the connection walls 45 are introduced. However, these walls may have respectively independent structures, and only one of these may be introduced.

EXAMPLE 8

Referring to FIG. 12C, the high refractive index portions 31a and 31b of the distributed Bragg reflector region 31 may be terminated at positions separated from the side edges 49 of the semiconductor chip in the direction along the second axis Ax2 orthogonal to the direction in which the laser waveguide structures 19 extend (the direction along the first axis Ax1). Terminal portions of the high refractive index portions 31a and 31b are isolated from the side edges 49 of the semiconductor chip by dielectric connection walls 47 that connect the low refractive index portions 31c, 31d, and 31e with one another. With the structure in this example, the high refractive index portions 31a and 31b each have a smaller width W1 than a device width W2 in the direction along the second axis Ax2. Therefore, as compared with a structure of W1=W2, that is, a structure in which the high refractive index portions reach the side edges 49 of the semiconductor chip, the ratio of W1 to the height H of the high refractive index portions in the direction of the normal to the principal surface 17c of the substrate 17 (H in FIG. 10) (W1/H) is decreased. In this structure, the mechanical strength of the high refractive index portions increases, and the high refractive index portions are less likely broken. Also, with this structure, the high refractive index portions 31a and 31b do not reach the side edges 49 of the semiconductor chip. Accordingly, in dry etching of the high refractive index portions, etching gas likely flows in the direction along the first axis Ax1 through the side edge portions. Hence, as compared with the structure in which the high refractive index portions reach the side edges 49 of the semiconductor chip, circulation of the gas during etching increases. As a result, a distribution of etching rate in the wafer due to the micro-loading effect is decreased and the etching rate is stabilized. Accordingly, the in-plane uniformity and the reproducibility in the etching process for the formation of the high refractive index portions are improved. Also, in actual device manufacturing, multiple semiconductor chips provided with the quantum cascade lasers 11 as shown in FIGS. 12A, 12B, and 12C are formed in a serially connected manner on a semiconductor wafer in which the side edge 49 serves as a boundary between device areas. Then, a crack is generated in a direction parallel to the boundary between the device areas (the direction along the first axis Ax1) by a method of cleavage or the like at the boundary (the side edges 49) and hence the connected chips are separated into individual chips. With the structure in which the high refractive index portions reach the side edges 49, the high refractive index portions are likely to be broken by an impact when a crack is generated at the boundary between the device areas and the devices are separated. Hence, the yield is decreased when the devices are separated. In contrast, with the structure of this example, since the high refractive index portions are not present at the side edges 49, the high refractive index portions are not damaged when the devices are separated. Accordingly, the decrease in the manufacturing yield due to the breakage of the high refractive index portions in the device separation can be avoided.

EXAMPLE 9

Figure 13:
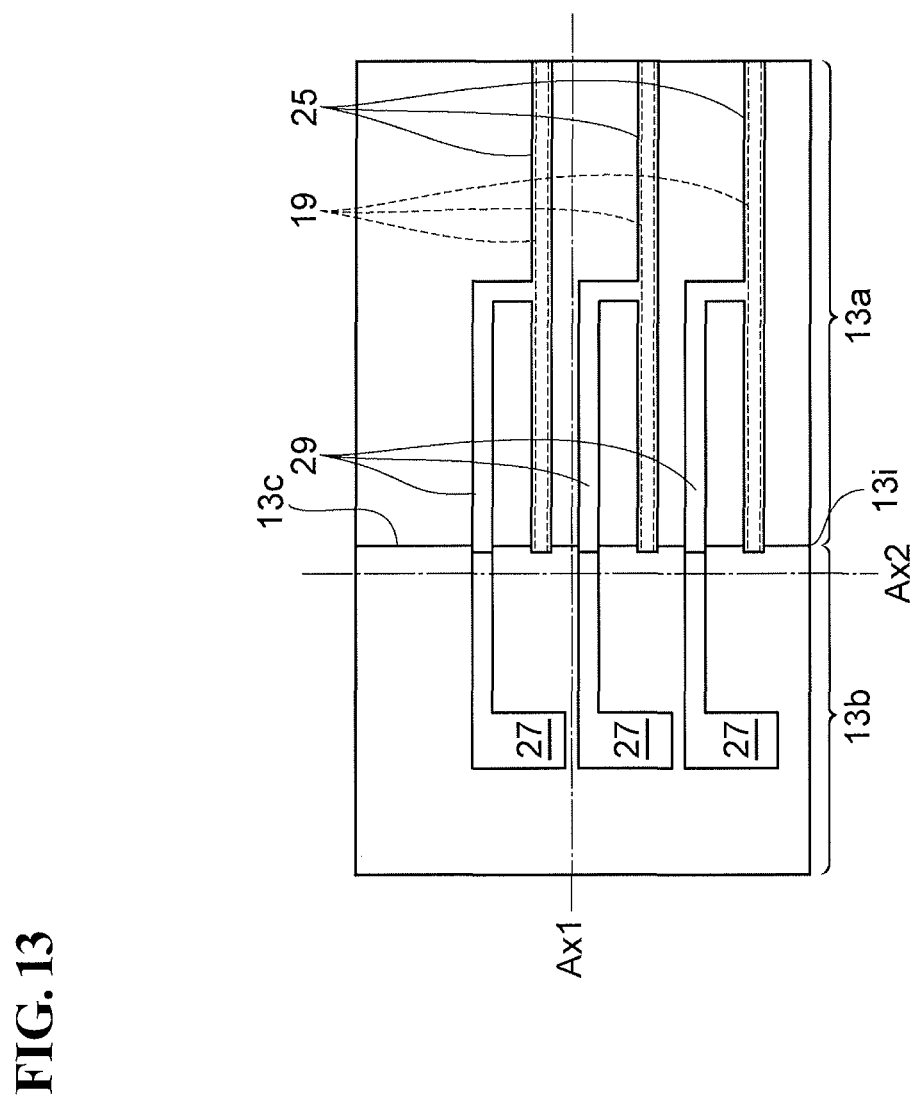
FIG. 13 is a plan view showing an example relating to structures of a first electrode, a wiring metal body, and a pad electrode for a quantum cascade laser according to Example 9.

FIG. 13 is a plan view showing a quantum cascade laser according to Example 9 relating to structures of the first electrodes 25, the wiring metal bodies 29, and the pad electrodes 27. The device structure shown in this drawing is similar to the configuration shown in FIG. 7A except for the material configuration of the upper electrode wiring. In the quantum cascade laser 11 of Example 9, the material configuring at least one region of the first electrodes 25, the wiring metal bodies 29, and the pad electrodes 27 differs from the material configuring the other regions. Therefore, the degree of freedom in design for the upper electrode wiring increases, and the optimization thereof becomes easy. For example, a gold (Au)-based material is desirable for the first electrodes 25 to form an ohmic contact with the contact layers 21e of the laser waveguide structures 19 and to form an Au plating layer on the first electrodes 25 for heat radiation. For the pad electrodes 27, the gold (Au)-based material is also desirable to connect Au wires with the pad electrodes 27 by using a wire bonding technique. In contrast, for example, copper (Cu) may be used for the wiring metal bodies 29 to obtain a low electric resistance and to reduce the manufacturing cost.

EXAMPLE 10

Figure 14:
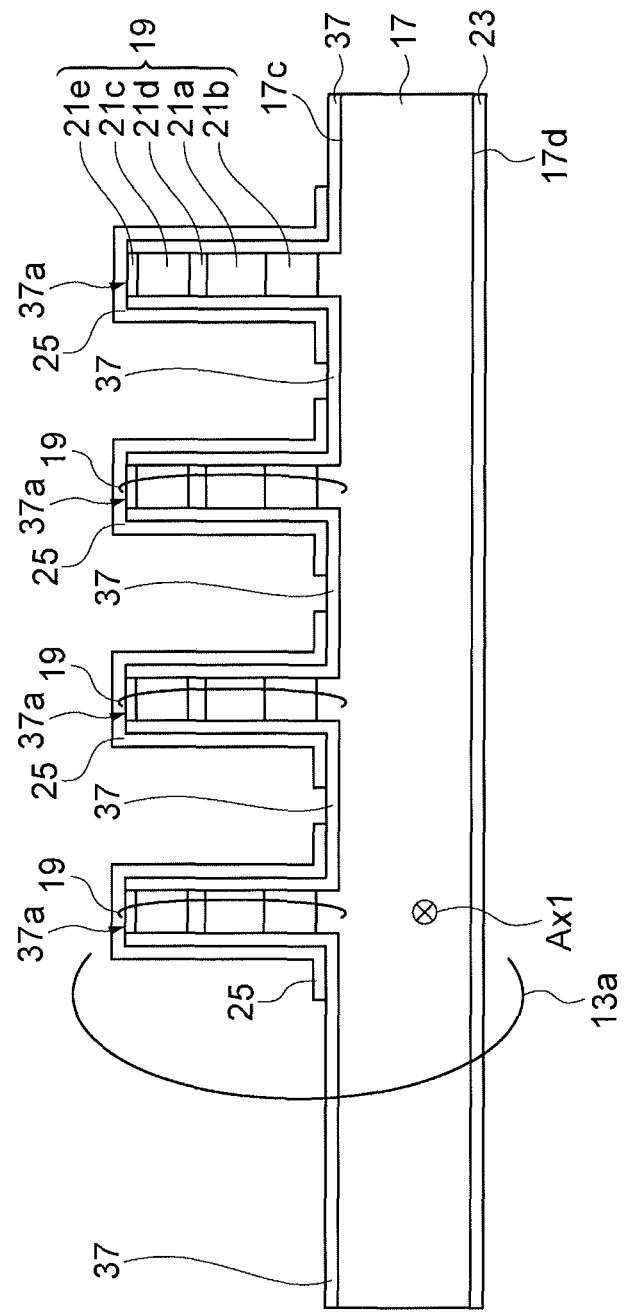
FIG. 14 is a drawing being a cross section showing Example 10 relating to a quantum cascade laser with a high mesa structure.

FIG. 14 is a cross section showing a quantum cascade laser of Example 10 having a high mesa structure. The cross section in FIG. 14 corresponds to the cross section taken along line III-III plotted in FIG. 3. In each of the quantum cascade lasers of Examples 1 to 9, the laser waveguide structures 19 have the buried-heterostructure in which the laser waveguide structures 19 are embedded with the semiconductor buried layer 41. However, any one of other desirable structures may be used. For example, as shown in FIG. 14, a high mesa structure in which the side surfaces of the mesa of the laser waveguide structures 19 are directly covered with the insulating layer 37 may be employed. The insulating layer 37 has the opening 37a at a position above the upper surface of each laser waveguide structure 19. The first electrode 25 provided at each laser waveguide structure 19 contacts the upper surface of the laser waveguide structure 19 through the opening 37a. Also, the first electrode 25 is provided on both side surfaces of the laser waveguide structure 19, and also at a position above the principal surface 17c of the substrate 17. The first electrode 25 extends in the direction along the first axis Ax1. With this waveguide structure, the mesa side walls of the laser waveguide structure 19 are covered with the insulating layer 37 having a refractive index much smaller than that of a semiconductor. Therefore, optical confinement in the core layer 21a is increased as compared with the buried-heterostructure in which the mesa side walls are embedded with the semiconductor buried layer 41. Accordingly, the lasing characteristics may be improved. Also, by using the structure of this example, it is enough to carry out crystal growth two times to complete the distribution feedback quantum cascade laser 11. Therefore, the manufacturing process can be simplified as compared with the buried-heterostructure that requires growth by three times.

As an example of a fabrication method, a fabrication method of the quantum cascade laser 11 with the distributed Bragg reflector region 31 according to Example 4 or 5 is described. In this description, for easier understanding, the reference signs used in the embodiment are used if possible. An n-type InP wafer is prepared as the substrate 17. On this InP wafer, an n-type InP layer which becomes the lower cladding layer 21b, a core layer 21a having a super-lattice structure (a quantum well layer: gallium indium arsenide (GaInAs), barrier layer: aluminum indium arsenide (AlInAs)), and an undoped or n-type GaInAs layer which becomes the diffraction grating layer 21d are successively grown. Then, the diffraction grating layer 21d having the diffraction grating in which the recesses and protrusions are periodically arranged with the period $\Lambda$ in the direction along the first axis Ax1 is formed as shown in FIG. 10 by using photolithography and etching. To emit light beams with different wavelengths from the respective integrated laser waveguide structures 19, the diffraction grating layers 21d having diffraction gratings with different periods A corresponding to the different lasing wavelengths are formed for the respective laser waveguide structures 19. After the formation of the diffraction gratings, an n-type InP layer which becomes the upper cladding layer 21c and an n-type GaInAs layer which becomes the contact layer 21e are successively grown and hence a stacked semiconductor layer is formed. For the growth, for example, a metal-organic vapor phase epitaxy (MOVPE) growth method or a molecular beam epitaxy (MBE) method is used. Also, an optical confinement layer for enhancing optical confinement of light propagating in the core layer 21a may be added to upper and lower sides of the core layer 21a if required. As the optical confinement layer, for example, undoped or n-type GaInAs or the like having a high refractive index may be used to increase the confinement of the light propagating in the core layer 21a. A first insulating layer mask having a plurality of stripe-shaped patterns for forming the laser waveguide structures 19 is formed on the stacked semiconductor layer. By using this first insulating layer mask, a plurality of stripe-shaped semiconductor mesas for providing the laser waveguide structures 19 is formed. If required, without removing the first insulating layer mask, a semiconductor stripe-shaped mesas are buried by semi-insulating or undoped InP to form a semiconductor buried layer 41. The semiconductor buried layer 41 may be made of GaInAs, AlInAs, gallium indium arsenide phosphide (GaInAsP), or aluminum gallium Indium arsenide (AlGaInAs). For the semi-insulating semiconductor such as semi-insulating InP, transition metal, such as Fe, titanium (Ti), chromium (Cr), or cobalt (Co) is added into the semiconductor such as InP. Thus a semiconductor region is formed. After the growth of the semiconductor buried layer, the first insulating layer mask is removed. On the semiconductor region, a second insulating layer mask having patterns that define the terrace region (the terrace 13d), the distributed Bragg reflector region 31, and the laser semiconductor region 33 is formed. By etching the semiconductor region by dry etching with use of the second insulating layer mask as an etching mask, the first end facet 13c, the terrace region (the terrace 13d), the semiconductor walls of the high refractive index portions of the distributed Bragg reflector region 31, and the semiconductor end facet 33a of the laser semiconductor region 33 are formed. Then, by depositing and etching a dielectric material for the low refractive index portions of the distributed Bragg reflector region 31, the distributed Bragg reflector region 31 is formed. To form the low refractive index portions, a dielectric material, such as BCB resin, polyimide resin, $SiO_2$, SiN, SiON, or alumina, may be used. These materials may be formed by a film deposition method, such as sputtering or spin coating. Then, $SiO_2$ is formed as the insulating layer 37 on the entire surface of the wafer. The insulating layer 37 may be made of SiN, SiON, alumina, polyimide resin, or BCB resin. Further, the opening 37a is formed in the insulating layer 37 on each of the laser waveguide structures 19. Then, metal for forming the first electrodes 25, the pad electrodes 27, and the wiring metal bodies 29 is deposited on the entire surface of the wafer, and their patterns are formed. Also, metal for forming the second electrode 23 is deposited on the back surface of the InP wafer. A gold-based material, such as Ti/Au or germanium (Ge)/Au, may be used as the material of the second electrode 23, the first electrodes 25, the pad electrodes 27, the wiring metal bodies 29, and the metal layers 39. With these steps, a substrate product including the array of the quantum cascade lasers 11 each including the plurality of laser waveguide structures 19 is formed.

The technical background of a mid-infrared quantum cascade laser is described. The mid-infrared quantum cascade laser is increasingly developed in recent years, as a small and low-cost light source usable in the mid-infrared field which is expected to be highly grown in future, such as environmental gas analysis, medical diagnosis, and industrial processing. For example, for use of gas sensing such as environmental gas analysis, to aim a specific absorption line of target gas, a single mode operation with the wavelength of the absorption line is required. Therefore, a diffraction grating (the diffraction grating layer 21d) for selecting the wavelength is useful. In case of a single mid-infrared quantum cascade laser, the lasing wavelength is basically fixed at a certain wavelength determined by the period of the diffraction gratin as described above. The wavelength may be tunable by a certain amount by a change in injection current or device temperature. However, it is difficult to provide wavelength tuning in a wide wavelength band. For this reason, the single mid-infrared quantum cascade laser measures only a gas component which has absorption lines in a narrow lasing wavelength band determined by the diffraction grating period. However, in a practical use, it is desired to analyze simultaneously a plurality of gas components with different absorption lines in a wide wavelength range.

By realizing an array light source in which a plurality of mid-infrared quantum cascade lasers emitting different lasing wavelengths are monolithically integrated on a single semiconductor substrate, a plurality of gas components may be analyzed simultaneously. In this case, when the cavities of the waveguides configuring the array are shortened, the power consumption can be decreased. Further, the decrease in the distance between the waveguides contributes to the decrease in the device size. These can contribute to the application of the mid-infrared quantum cascade laser array to the practical uses such as gas sensing. However, with such an array, the number of pad electrodes increases in accordance with the number of waveguide structures. Arranging many pad electrodes restricts the arrangement and size of the waveguide structures. To be more specific, in an array of mid-infrared quantum cascade lasers of related art, waveguide structures and pad electrodes are formed in the same region. Hence, the distance between the waveguides and the cavity length of the waveguides are restricted by the pad electrode size which requires a region of, for example, 100 μm×100 μm or larger for wire bonding. Therefore, it is difficult to attain both the decrease in distance between the waveguides and the decrease in length of the cavity. With the quantum cascade laser in the embodiment, the decrease in length of the cavity reduces the power consumption. In addition, the decrease in the distance between channels contributes to the decrease in chip size.

The quantum cascade laser according to the present invention is not limited to the quantum cascade laser described in the aforementioned embodiment. For example, in the above-described embodiment, each laser waveguide structure 19 includes the diffraction grating layer 21d; however, the laser waveguide structure 19 does not have to include the diffraction grating layer 21d. For example, when each laser waveguide structure 19 does not include the diffraction grating layer 21d, the plurality of quantum cascade lasers included in the quantum cascade laser configure a so-called Fabry-Perot quantum cascade laser.

The principle of the present invention has been described with the preferable embodiment; however, it is recognized by those skilled in the art that the present invention may be changed in arrangement and detail without departing from the principle. The present invention is not limited to the specific configuration disclosed in the embodiment. Therefore, the right is claimed on all correction and modification based on the scope of the claims and the scope of the spirit thereof.

What is claimed is:

1. A quantum cascade laser comprising:
   a substrate having a first substrate region and a second substrate region arranged along a first axis;
   a laser structure body including a laser body region disposed on the first substrate region, the laser structure body including a first region including the first substrate region and a second region including the second substrate region, the laser body region having a plurality of laser waveguide structures each having a mesa and extending along the first axis, and a plurality of buried regions embedding side surfaces of the mesas of the laser waveguide structures, the laser body region having an end facet located at a boundary between the first region and the second region, the second region including a terrace extending along the first axis from a bottom edge of the end facet, each laser waveguide structure including a core layer having a core end facet that is included in the end facet of the laser body region;

a plurality of electrodes;

a plurality of pad electrodes; and a plurality of wiring metal bodies each of which connects a corresponding one of the electrodes to a corresponding one of the pad electrodes, wherein each of the electrodes is disposed on the mesa of a corresponding one of the laser waveguide structures, each of the pad electrodes is disposed on the terrace, each of the wiring metal bodies includes a first portion disposed on the terrace, and a second portion disposed on the end facet of the laser body region, the end facet of the laser body region is configured to be a single reflection mirror common to the plurality of laser waveguide structures, the second portion of each wiring metal body is disposed on the core end facet of the laser body, and has a width, along a second axis intersecting the first axis, that is larger than a width, along the second axis, of its corresponding laser waveguide structure, and the pad electrodes are arranged in a direction along the first axis at different distances from the end facet of the laser body region.

2. The quantum cascade laser according to claim 1, further comprising an insulating layer disposed on the end facet, wherein the second portion of each wiring metal body is disposed on the insulating layer, and the second portion of each wiring metal body is separated from the core end facet of the core layer.

3. The quantum cascade laser according to claim 1, wherein the laser body region includes a distributed Bragg reflector region and a laser semiconductor region arranged along the first axis, the laser semiconductor region has a semiconductor end facet extending in a direction intersecting with the first axis, the distributed Bragg reflector region includes at least one high refractive index portion extending in a direction normal to a principal surface of the substrate, the at least one high refractive index portion is isolated from the semiconductor end facet of the laser semiconductor region, the distributed Bragg reflector region includes the end facet, and the distributed Bragg reflector region is disposed between the second region and the laser semiconductor region.

4. The quantum cascade laser according to claim 1, wherein each of the plurality of laser waveguide structures reaches the end facet.

5. A quantum cascade laser comprising:

a substrate having a first substrate region and a second substrate region arranged along a first axis;

a laser structure body including a laser body region disposed on the first substrate region, the laser structure body including a first region including the first substrate region and a second region including the second substrate region, the laser body region having a plurality of mesas of which each includes a laser waveguide structure extending along the first axis, and a plurality of buried regions embedding side surfaces of the mesas, the laser body region having an end facet located at a boundary between the first region and the second region, the second region including a terrace extending along the first axis from a bottom edge of the end facet, each laser waveguide structure including a core layer having a core end facet that is included in the end facet of the laser body region;

a plurality of electrodes of which each is disposed on one of the plurality of mesas;

a plurality of pad electrodes disposed on the terrace;

a plurality of wiring metal bodies of which each includes a first portion disposed on the terrace, a second portion disposed on the end facet, and a third portion disposed on a top surface of one of the buried regions in the laser body region;

a metal layer disposed on the core end facet of the core layer of at least one of the plurality of laser waveguide structures; and an insulating layer disposed between the core end facet of the core layer of said at least one of the plurality of laser waveguide structures and the metal layer, wherein each pad electrode is connected with one of the electrodes disposed on the mesas through one of the wiring metal bodies, the end facet of the laser body region is configured to be a single reflection mirror common to the plurality of laser waveguide structures, the second portion of the wiring metal bodies bypass the core end facets, the metal layer is isolated from the second portion of the wiring metal body connecting one of the pad electrodes to the electrode disposed on the mesa of said at least one of the plurality of laser waveguide structures, and said at least one of the plurality of laser waveguide structures has a width in a direction along a second axis intersecting the first axis, the metal layer having a width, in the direction of the second axis, that is larger than the width of the said at least one of the plurality of laser waveguide structures.

* * * * *